(12) United States Patent
Hayashi

(10) Patent No.: US 9,984,958 B2
(45) Date of Patent: May 29, 2018

(54) LEADFRAME AND SEMICONDUCTOR DEVICE

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days. days.

(21) Appl. No.: 15/290,102

(22) Filed: Oct. 11, 2016

(65) Prior Publication Data

US 2017/0133300 A1    May 11, 2017

(30) Foreign Application Priority Data

Nov. 5, 2015  (JP) ................. 2015-217896

(51) Int. Cl.
*H01L 23/495* (2006.01)
*H01L 21/48* (2006.01)
(Continued)

(52) U.S. Cl.
CPC .... *H01L 23/49548* (2013.01); *H01L 21/4828* (2013.01); *H01L 23/49541* (2013.01); *H01L 23/49582* (2013.01); *H01L 24/97* (2013.01); *H01L 21/561* (2013.01); *H01L 21/568* (2013.01); *H01L 23/295* (2013.01); *H01L 23/3121* (2013.01); *H01L 24/29* (2013.01); *H01L 24/32* (2013.01); *H01L 24/48* (2013.01); *H01L 24/73* (2013.01); *H01L 24/81* (2013.01); *H01L 24/83* (2013.01); *H01L 24/85* (2013.01); *H01L 24/92* (2013.01); *H01L 2224/131* (2013.01); *H01L 2224/13144* (2013.01); *H01L 2224/13147* (2013.01); *H01L 2224/16245* (2013.01); *H01L 2224/291* (2013.01); *H01L 2224/2919* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/73265* (2013.01);
(Continued)

(58) Field of Classification Search
CPC ...................... H01L 23/495; H01L 23/49503
USPC ......................................... 257/666; 438/123
See application file for complete search history.

(56) References Cited

U.S. PATENT DOCUMENTS 7,112,474 B1 *  9/2006  Glenn ................. H01L 21/4842
                                              257/23.043
7,205,180 B1 *  4/2007  Sirinorakul ......... H01L 21/4835
                                              257/23.031
(Continued)

FOREIGN PATENT DOCUMENTS

JP       2014-044980       3/2014

*Primary Examiner* — David Vu
*Assistant Examiner* — Brandon Fox
(74) *Attorney, Agent, or Firm* — IPUSA, PLLC

(57) ABSTRACT

A semiconductor device includes a leadframe, a semiconductor chip, and an encapsulation resin encapsulating the leadframe and the semiconductor chip. The leadframe includes a first surface and a second surface facing away from the first surface. The semiconductor chip is mounted on the first surface of the leadframe. A part of the second surface of the leadframe is depressed toward the first surface to form a step surface. The step surface includes an uneven surface part where depressions are formed, and is covered with the encapsulation resin.

15 Claims, 21 Drawing Sheets

(51) Int. Cl.
  *H01L 23/29*  (2006.01)
  *H01L 23/31*  (2006.01)
  *H01L 21/56*  (2006.01)
  *H01L 23/00*  (2006.01)

(52) U.S. Cl.
  CPC ............... *H01L 2224/81439* (2013.01); *H01L 2224/81444* (2013.01); *H01L 2224/81455* (2013.01); *H01L 2224/83385* (2013.01); *H01L 2224/85439* (2013.01); *H01L 2224/85444* (2013.01); *H01L 2224/85455* (2013.01); *H01L 2224/92247* (2013.01); *H01L 2224/97* (2013.01); *H01L 2924/18161* (2013.01)

(56) References Cited

U.S. PATENT DOCUMENTS

| | | | |
|---|---|---|---|
| 8,174,096 B2* | 5/2012 | Chi Chan | H01L 21/4842 257/666 |
| 8,736,037 B2* | 5/2014 | Powell | H01L 21/4832 257/666 |
| 2009/0039486 A1* | 2/2009 | Shimazaki | H01L 21/561 257/676 |
| 2010/0171201 A1* | 7/2010 | Wyant | H01L 23/49503 257/676 |
| 2011/0227208 A1* | 9/2011 | Kim | H01L 21/4832 257/676 |

* cited by examiner

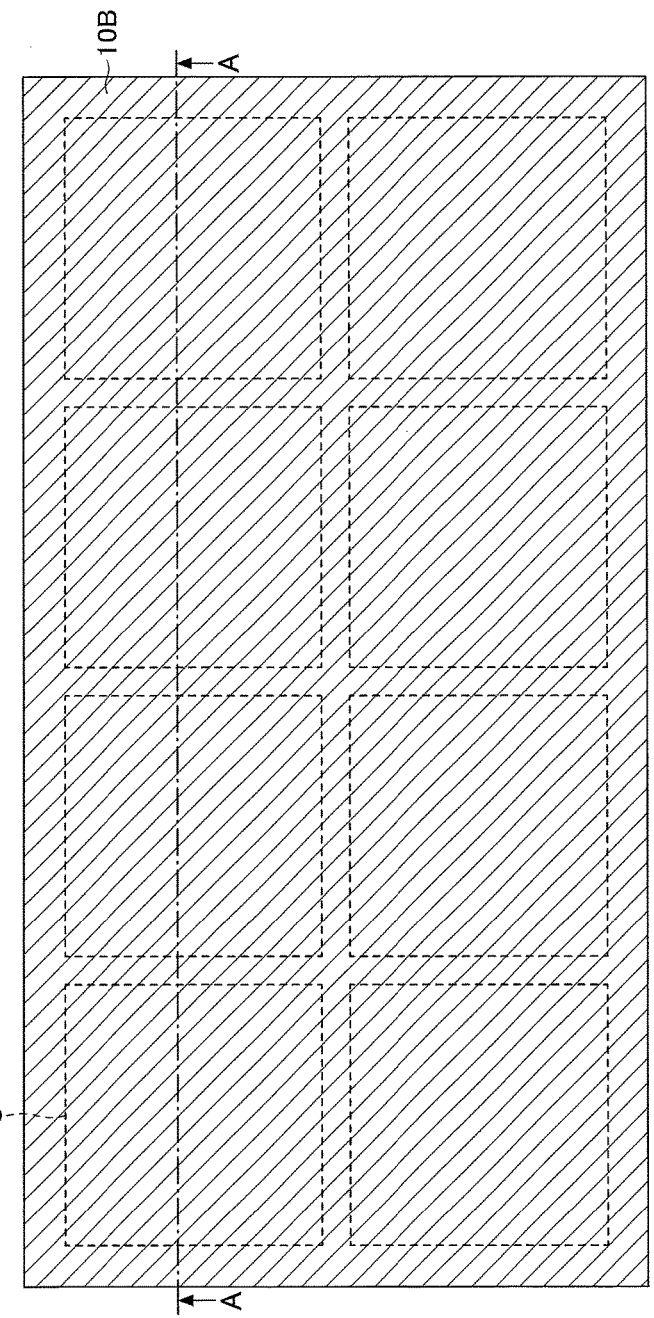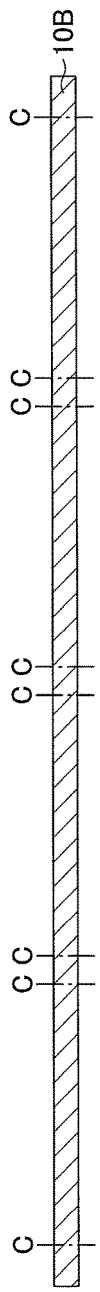
FIG.4A
FIG.4B

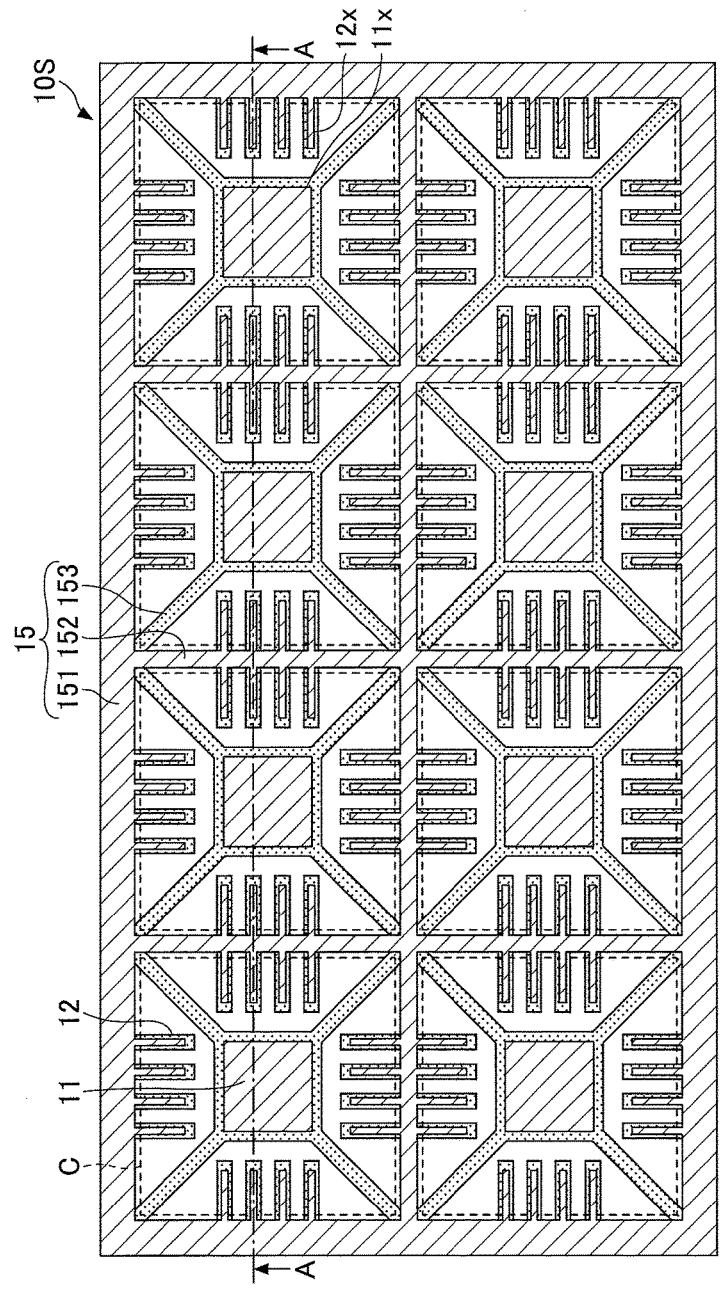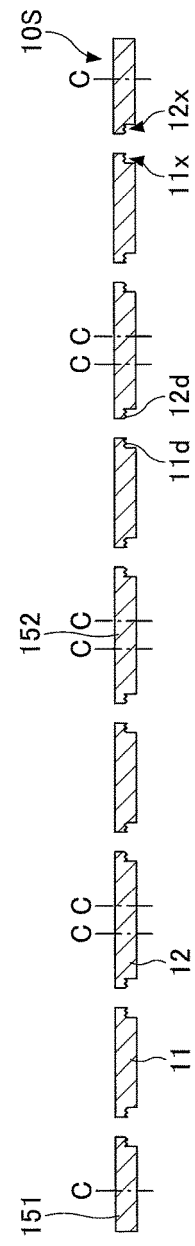
FIG.8A
FIG.8B

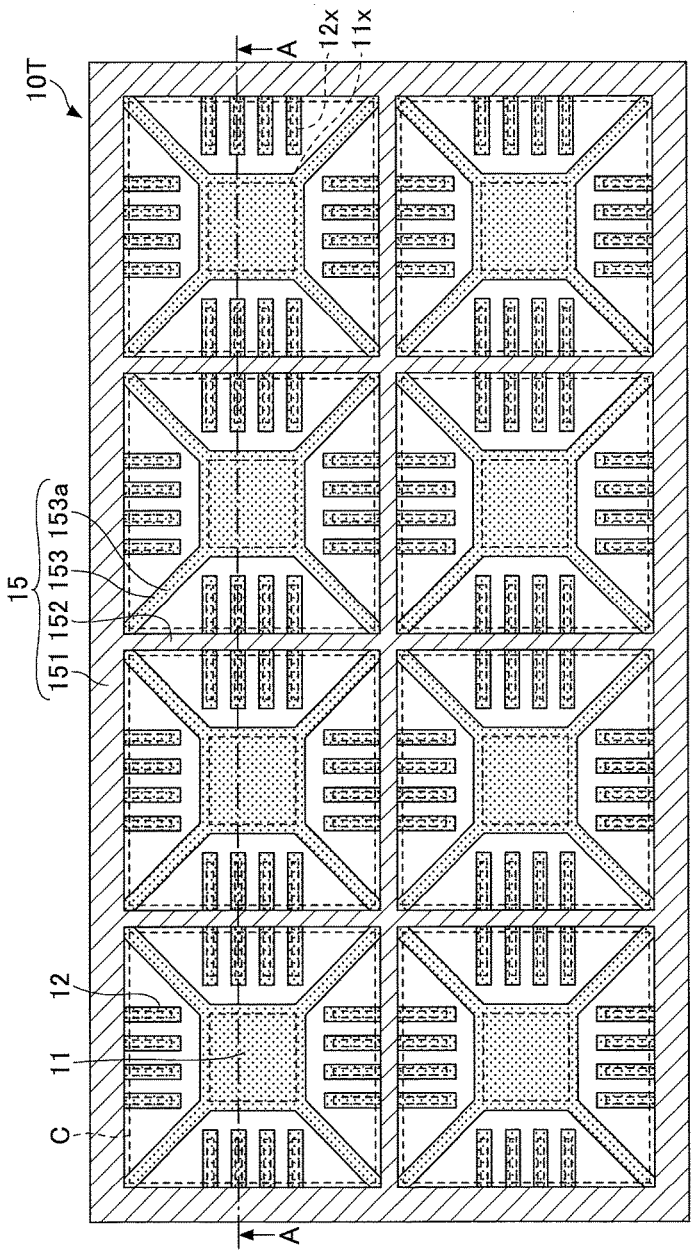
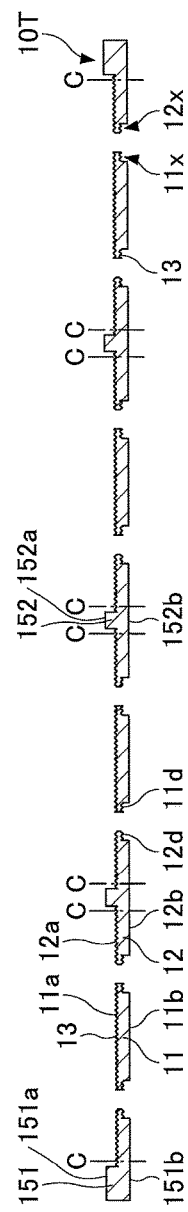
FIG.14A
FIG.14B

LEADFRAME AND SEMICONDUCTOR DEVICE

CROSS-REFERENCE TO RELATED APPLICATION

This application is based upon and claims the benefit of priority of the prior Japanese Patent Application No. 2015-217896, filed on Nov. 5, 2015, the entire contents of which are incorporated herein by reference.

FIELD

A certain aspect of the embodiments discussed herein is related to leadframes and semiconductor devices.

BACKGROUND

Semiconductor devices in which a semiconductor chip is mounted on a leadframe and encapsulated in resin are known. Because such semiconductor devices generate heat to repeatedly expand and contract during their operations, the semiconductor devices may delaminate at the interface between the leadframe and resin. Therefore, according to such semiconductor devices, the lower surfaces of a die pad and leads are stepped to form stepped parts, and the resin is caused to run around the peripheral edges of the die pad and leads to enter the stepped parts, thereby increasing the adhesion between the resin and the die pads and leads.

Reference may be made to Japanese Laid-open Patent Publication No. 2014-44980 for related art.

SUMMARY

According to an aspect of the present invention, a semiconductor device includes a leadframe, a semiconductor chip, and an encapsulation resin encapsulating the leadframe and the semiconductor chip. The leadframe includes a first surface and a second surface facing away from the first surface. The semiconductor chip is mounted on the first surface of the leadframe. A part of the second surface is depressed toward the first surface to form a step surface. The step surface includes an uneven surface part where depressions are formed, and is covered with the encapsulation resin.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 4A and 4B are diagrams depicting a process of manufacturing a semiconductor device according to the first embodiment;

FIGS. 8A and 8B are diagrams depicting the process of manufacturing a semiconductor device according to the first embodiment;

FIGS. 14A and 14B are diagrams depicting the process of manufacturing a semiconductor device according to the second embodiment;

DESCRIPTION OF EMBODIMENTS

Figure 1A:
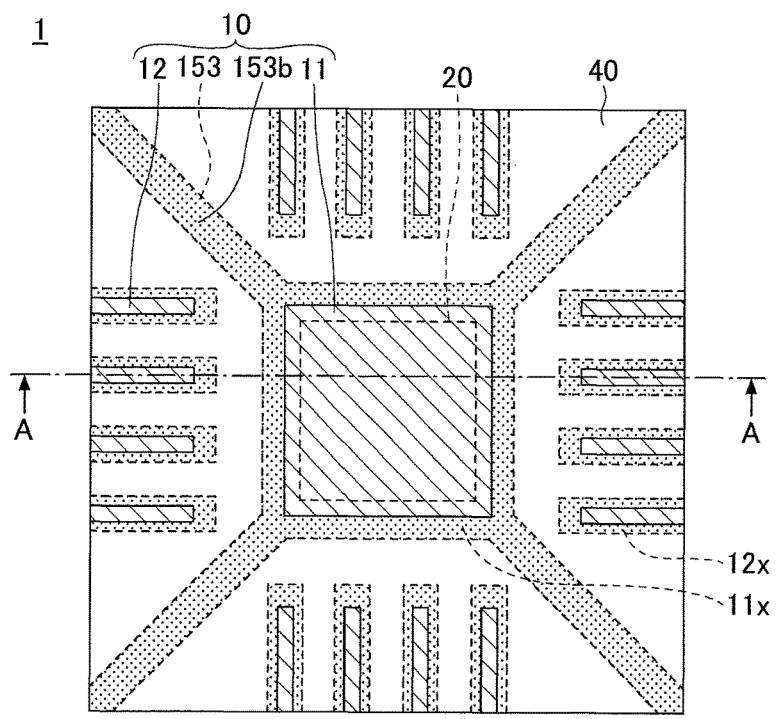
FIGS. 1A through 1D are diagrams depicting a semiconductor device according to a first embodiment.

As noted above, there are semiconductor devices in which the lower surfaces of a die pad and leads are stepped to form stepped parts, and the resin is caused to run around the peripheral edges of the die pad and leads to enter the stepped parts, thereby increasing the adhesion between the resin and the die pads and leads. According to this technique, however, the surface area of the contact (interface) between the resin and the stepped parts formed in the die pad and leads cannot be large enough to achieve as much adhesion as expected.

According to an aspect of the present invention, a semiconductor device in which the surface area of the contact between resin and a stepped part formed in a leadframe is increased to increase the adhesion between the leadframe and the resin is provided.

Preferred embodiments of the present invention will be explained with reference to accompanying drawings. In the drawings, the same configuration is referred to using the same reference numeral, and a repetitive description thereof may be omitted.

[a] First Embodiment

Figure 1B:
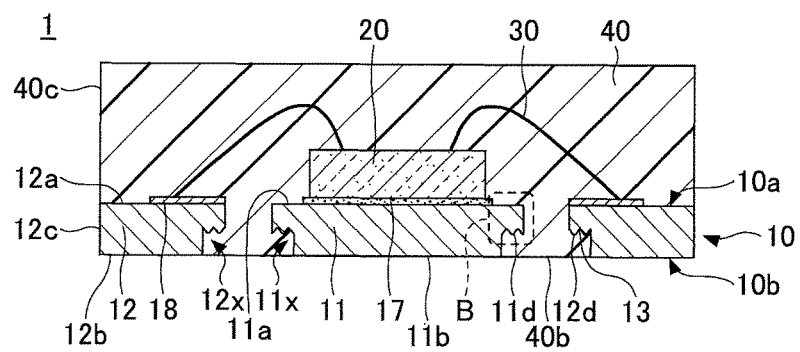
Figure 1C:
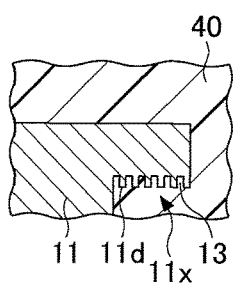
Figure 1D:
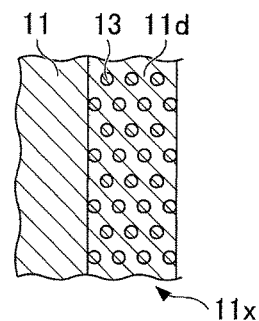

First, a structure of a semiconductor device according to a first embodiment is described. FIG. 1A is a bottom view of a semiconductor device according to the first embodiment. FIG. 1B is a cross-sectional view of the semiconductor device, taken along a line A-A in FIG. 1A. FIG. 1C is an enlarged cross-sectional view of a part indicated by B ("part B") in FIG. 1B. FIG. 1D is an enlarged bottom view of part of the part B in FIG. 1B. The bottom view of FIG. 1A except for resin 40 is provided with hatching lines corresponding to those in FIG. 1B to facilitate understanding of the drawings. Furthermore, in FIG. 1D, the resin 40 is not depicted for clarity.

Referring to FIGS. 1A through 1D, a semiconductor device 1 includes a leadframe 10, a semiconductor chip 20, metal wires 30 (bonding wires), and the resin 40 (encapsulation resin). The semiconductor device 1 is a so-called quad flat non-leaded (QFN) package-type semiconductor device.

According to this embodiment, for convenience of description, the semiconductor chip 20 side of the semiconductor device 1 will be referred to as "upper side" or "first side," and the leadframe 10 side of the semiconductor device 1 will be referred to as "lower side" or "second side." Furthermore, with respect to each part or element of the semiconductor device 1, a surface on the semiconductor chip 20 side will be referred to as "upper surface" or "first surface," and a surface on the leadframe 10 side will be referred to as "lower surface" or "second surface." The semiconductor device 1, however, may be used in an inverted position or oriented at any angle. Furthermore, a plan view refers to a view of an object taken in a direction normal to the first or second surface of the leadframe 10, and a planar shape refers to the shape of an object viewed in a direction normal to the first or second surface of the leadframe 10.

According to the semiconductor device 1, the leadframe 10 includes a die pad 11 (a chip mounting part) on which the semiconductor chip 20 is mounted, leads 12 (terminals), and support bars 153. Suitable materials for the leadframe 10 include, for example, metal materials such as copper (Cu), copper alloys, and alloy 42 (an iron-nickel [Fe—Ni] alloy).

The leads 12 are electrically independent of the die pad 11, and are provided around the die pad 11 with a predetermined pitch in a plan view. The leads 12 do not have to be provided on the four sides of the die pad 11, and may be provided on, for example, only two opposite sides among the four sides. The width of the leads 12 may be, for example, approximately 0.2 mm. The pitch of the leads 12 may be, for example, approximately 0.4 mm. The leads 12 may be hereinafter collectively referred to as "lead 12" when features common to the leads 12 are described. Likewise, the metal wires 30 may be hereinafter collectively referred to as "metal wire 30" and the support bars 153 may be hereinafter collectively referred to as "support bar 153."

A plating film 18 is formed in a region connected to the metal wire 30 on an upper surface 12a of the lead 12. Examples of the plating film 18 include metal films such as a silver (Ag) film, a gold (Au) film, a Ni/Au film (a laminated metal film of a Ni film and a Au film stacked in this order), and a Ni/Pd/Au film (a laminated metal film of a Ni film, a palladium [Pd] film, and a Au film stacked in this order). By forming the plating film 18, it is possible to improve connectability (wire bondability) to the metal wire 30. The plating film 18 may be formed on an as-needed basis and be omitted.

A lower surface 10b of the leadframe 10 is stepped to form a stepped part where the thickness of the leadframe 10 is reduced. That is, in the stepped part, the lower surface 10b is depressed toward an upper surface 10a of the leadframe 10 to form a step surface facing away from the upper surface 10a. Specifically, a step part 11x is provided around a lower surface 11b of the die pad 11. In other words, the lower surface 11b is smaller in area than an upper surface 11a of the die pad 11, and a step surface 11d (lower surface) of the stepped part 11x is provided around a surface of the die pad 11 exposed at a bottom (lower) surface 40b of the resin 40, namely, the lower surface 11b of the die pad 11, in a plan view.

Furthermore, a stepped part 12x is provided along a peripheral edge of a lower surface 12b of the lead 12 on the three sides of the lead 12 other than the side on which the lead 12 is exposed at a side surface 40c of the resin 40. That is, the lower surface 12b of the lead 12 is smaller in area than the upper surface 12a, and a step surface 12d (lower surface) of the stepped part 12x is provided along a peripheral edge of a surface of the lead 12 exposed at the bottom surface 40b of the resin 40, namely, the lower surface 12b of the lead 12, on the three sides of the lead 12 other than the side on which the lead 12 is exposed at the side surface 40c of the resin 40, in a plan view. The step surface 11d of the stepped part 11x and the step surface 12d of the stepped part 12x are covered with the resin 40. The stepped parts 11x and 12x are provided to cause the resin 40 to enter the stepped parts 11x and 12x. Accordingly, it is possible to prevent the die pad 11 and the lead 12 from coming off of the resin 40.

The support bar 153 is a member supporting the die pad 11 before the leadframe 10 is cut out through a singulation process. The support bar 153 is half-etched on its bottom (lower) side to have substantially the same thickness as the step parts 11x and 12x. Accordingly, a bottom (lower) surface 153b of the support bar 153 is completely covered with the resin 40 and not exposed on the resin 40.

The semiconductor chip 20 is mounted face up on the die pad 11. The semiconductor chip 20 may be mounted on the die pad 11 through an adhesive 17 such as a die attach film (a die bonding process). As the adhesive 17, adhesive paste may be used in lieu of an adhesive film such as a die attach film. Each of electrode terminals at the upper surface of the semiconductor chip 20 is electrically connected (wire-bonded) to the plating film 18 formed on the upper surface 12a of the lead 12 via one of the metal wires 30, such as gold or copper wires.

The resin 40 encapsulates the leadframe 10, the semiconductor chip 20, and the metal wires 30. The lower surface 11b of the die pad 11, the lower surface 12b of the lead 12, and a side surface 12c of the lead 12 forming part of the peripheral surface of the semiconductor device 1 are not covered with the resin 40 to be exposed. That is, the resin 40 encapsulates the semiconductor chip 20, the metal wires 30, and part of the leadframe 10 to expose part of the die pad 11 and part of the lead 12. The exposed part of the lead 12 serves as an external connection terminal.

The lower surface 11b of the die pad 11 and the lower surface 12b of the lead 12 may be substantially flush with the bottom surface 40b of the resin 40. The side surface 12c of the lead 12 may be substantially flush with the side surface 40c of the resin 40. The resin 40 may be, for example, a so-called mold resin that is epoxy resin containing a filler.

An uneven surface part 13 is formed in the step surfaces 11d and 12d of the step parts 11x and 12x, respectively. Furthermore, although not depicted, the uneven surface part 13 is also formed in the lower surface 153b of the support bar 153. A region in which the uneven surface part 13 is provided is schematically indicated by a dotted pattern in FIG. 1A and by a corrugated line in FIG. 1B.

The uneven surface part 13 is formed in neither the upper surface 11a of the die pad 11 nor the upper surface 12a of the lead 12. Furthermore, the uneven surface part 13 is not formed in parts of the die pad 11 and the lead 12 that are not covered with the resin 40 to be exposed. Surfaces in which the uneven surface part 13 is not formed are flat compared with surfaces in which the uneven surface part 13 is formed.

The uneven surface part 13, however, may be formed in, for example, the lower surface 11b of the die pad 11 and the lower surface 12b of the lead 12, which are not covered with the resin 40 to be exposed. In this case, the uneven surface part 13 produces the effect that the adhesion of the die pad 11 and the lead 12 to a bonding material such as solder to be provided on the lower surfaces 11b and 12b is improved.

The uneven surface part 13 is, for example, where fine depressions (dimples) having a substantially circular planar shape are vertically and laterally arranged at high density. The uneven surface part 13 may have depressions regularly arranged. For example, the uneven surface part 13 may have depressions arranged like a lattice such as a face-centered lattice. Referring to FIG. 10, depressions of the uneven surface part 13 are depicted as having a rectangular cross section, while the depressions are practically formed to have a concave cross section whose bottom curves upward (inward).

The diameter of the depressions is preferably 0.020 mm to 0.060 mm, and more preferably, 0.020 mm to 0.040 mm. The pitch of the depressions is preferably 0.040 mm to 0.080 mm. The depth of the depressions is preferably approximately 35% to approximately 70% of the thickness of the leadframe 10, and may be, for example, approximately 0.010 mm to approximately 0.050 mm.

According to the uneven surface part 13, the planar shape of the depressions is not limited to a substantial circle, and may be, for example, a polygon such as a hexagon. In this case, the diameter of the circumcircle of a polygon is preferably 0.020 mm to 0.060 mm, and more preferably, 0.020 mm to 0.040 mm. The pitch of the circumcircles is preferably 0.040 mm to 0.080 mm.

Figure 2:
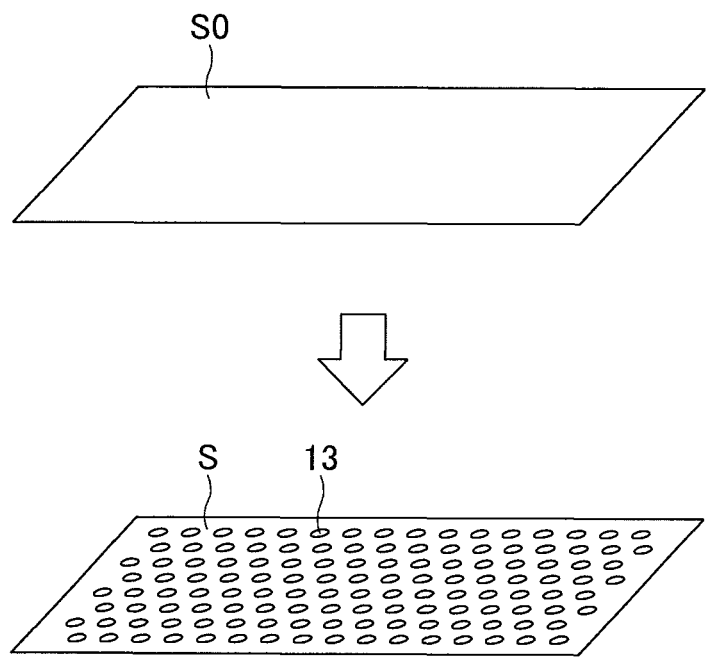
FIG. 2 is a diagram illustrating an S ratio.

According to embodiments of the present invention, the term "uneven surface part" refers to a part where the planar shape of depressions formed in a surface is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and the S ratio of the part (uneven surface part) is 1.7 or more. Here, the S ratio refers to the ratio of S to S0, where S0 is the surface area of a planar surface and S is the surface area of the uneven surface part formed in the planar surface as depicted in FIG. 2. That is, the S ratio is S/S0. A surface of the uneven surface part may be plated with, for example, silver. In this case, S is the area of the plated surface of the uneven surface part.

If the diameter of the depressions or the diameter of the circumcircle of the polygon is smaller than 0.020 mm or greater than 0.060 mm, it is difficult to increase the S ratio, so that adhesion to resin does not increase.

The uneven surface part 13 is thus provided in the step surface 11d of the stepped part 11x, the step surface 12d of the stepped part 12x, and the lower surface 153b of the support bar 153 to increase the surface area of a part of the leadframe 10 that contacts the resin 40. Therefore, an anchoring effect is produced to make it possible to increase the adhesion between the leadframe 10 and the resin 40. As a result, it is possible to prevent delamination of the leadframe 10 and the resin 40 at their interface. The S ratio of a conventional uneven surface part is approximately 1 to approximately 1.2, with which it is difficult to ensure sufficient adhesion to resin.

Furthermore, the uneven surface part 13 is provided in the step surface 11d of the stepped part 11x and the step surface 12d of the stepped part 12x to prevent the spread of removal of the resin part 40 from the leadframe 10 and prevent the entry of moisture into the semiconductor device 1. These effects are described with reference to FIGS. 3A and 3B.

When moisture enters the interface between resin and a leadframe in a semiconductor device, the moisture entering the interface may cause the problem (a so-called popcorn phenomenon) that the moisture suddenly expands and vaporizes to generate a crack in the resin during a reflow process or the like when the semiconductor device is mounted on a mounting board. The popcorn phenomenon occurs to break the semiconductor device. According to the semiconductor device 1, the uneven surface part 13 is provided in the step surface 11d of the stepped part 11x and the step surface 12d of the stepped part 12x to make it possible to prevent the occurrence of the popcorn phenomenon. As a result, it is possible to prevent the breakage of the semiconductor device 1.

Figure 3A:
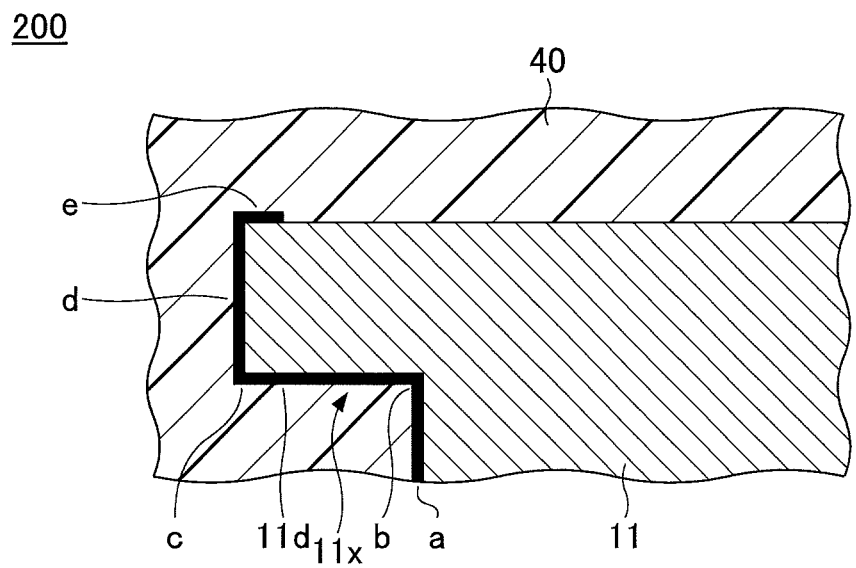
FIGS. 3A and 3B are diagrams illustrating effects produced by providing an uneven surface part in a step surface of a stepped part.

FIG. 3A is a diagram depicting a semiconductor device according to a comparative example, where the uneven surface part 13 is not provided in the step surface 11d of the stepped part 11x. Although not depicted, the uneven surface part 13 is not provided in the step surface 12d of the stepped part 12x, either. According to a semiconductor device 200 depicted in FIG. 3A, once delamination occurs at a point "a" at the interface between the die pad 11 and the resin 40, the delamination propagates to points "b," "c," "d" and "e" in this order to spread. Furthermore, once moisture enters the interface between the die pad 11 and the resin 40 at the point "a," the moisture moves deeper along the interface through the points "b," "c," "d" and "e" in this order.

Figure 3B:
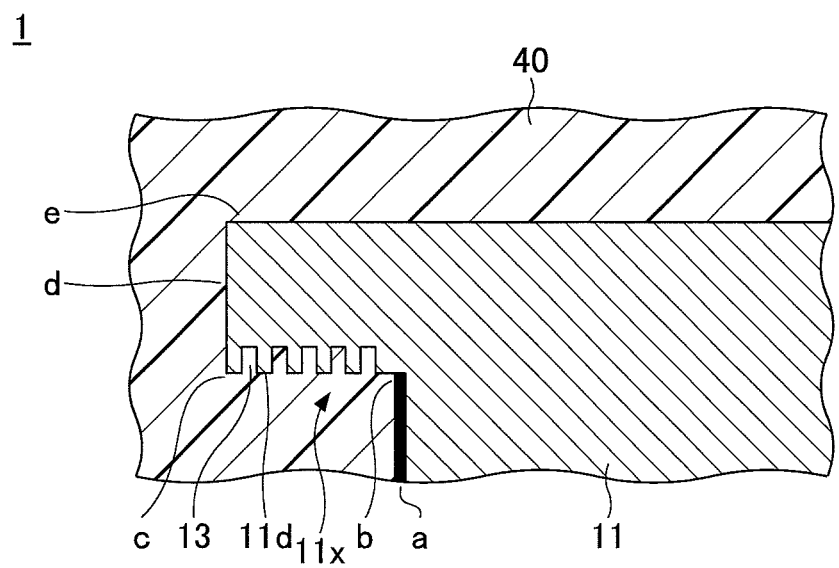

In contrast, according to the semiconductor device 1 depicted in FIG. 3B, the uneven surface part 13 is provided in the step surface 11d of the stepped part 11x. Therefore, when delamination occurs at the interface between the die pad 11 and the resin 40 at the point "a," the delamination may propagate up to the point "b," but is prevented from further propagating and spreading to the points "c," "d" and "e" because of the increased adhesion between the die pad 11 and the resin 40 at the step surface 11d where the uneven surface part 13 is provided. Likewise, when moisture enters the interface between the die pad 11 and the resin 40 at the point "a," the moisture may move along the interface to the point "b," but is prevented from moving further to the points "c," "d" and "e" because of the increased adhesion between the die pad 11 and the resin 40 at the step surface 11d where the uneven surface part 13 is provided.

While the above description is given of the stepped part 11x, the same effects are produced with respect to the stepped part 12x as well. Furthermore, in the case of providing the uneven surface part 13 in a part of the leadframe 10 other than the stepped part 11x or 12x, the adhesion to the resin 40 increases to produce the delamination propagation prevention effect and the moisture entry prevention effect in that part the same as in the case of the stepped parts 11x and 12x.

Next, a method of manufacturing a semiconductor device according to a first embodiment is described. FIGS. 4A through 9C are diagrams depicting a process of manufacturing a semiconductor device according to the first embodiment.

First, in the process depicted in FIGS. 4A and 4B, a metal plate 10B ("plate 10B") having a predetermined shape is prepared. FIG. 4A is a plan view of the plate 10B. FIG. 4B is a cross-sectional view of the plate 10B, taken along a line A-A in FIG. 4A. The plan view of FIG. 4A is provided with hatching lines corresponding to those in FIG. 4B to facilitate understanding of the drawings. The plate 10B is ultimately cut along scribe lines indicated by a dashed line into multiple individual regions C that become leadframes 10 (see FIGS. 1A through 1D). Suitable materials for the plate 10B include, for example, copper, copper alloys, and alloy 42. The thickness of the plate 10B may be, for example, approximately 100 μm to approximately 200 μm.

Next, in the process depicted in FIGS. 5A through 5D, a photoresist 300 ("resist 300") and a photoresist 310 ("resist 310") are formed on an upper surface 10Ba and a lower surface 10Bb, respectively, of the plate 10B. Then, the resists 300 and 310 are exposed to light and developed to form openings 300x at predetermined positions in the resist 300 and form openings 310x and 310y at predetermined positions in the resist 310.

Referring to FIGS. 5A through 5D, the openings 300x and 310x are openings for forming the die pad 11, the leads 12, and the support bars 153 in the plate 10B. The openings 300x and 310x are positioned one over the other in a plan view. Furthermore, the openings 310y are openings for forming the uneven surface part 13 and reducing the thickness of the plate 10B on its lower surface 10Bb side. The openings 310y are provided over a part of the plate 10B where the stepped parts 11x and 12x are to be formed and a part of the plate 10B where the support bars 153 are to be formed. The openings 310y are, for example, multiple circular openings that are vertically and laterally arranged. The diameter of the circular openings is preferably 0.020 mm to 0.060 mm, and more preferably, 0.020 mm to 0.040 mm. The pitch of the circular openings is preferably 0.040 mm to 0.080 mm.

Figure 5A:
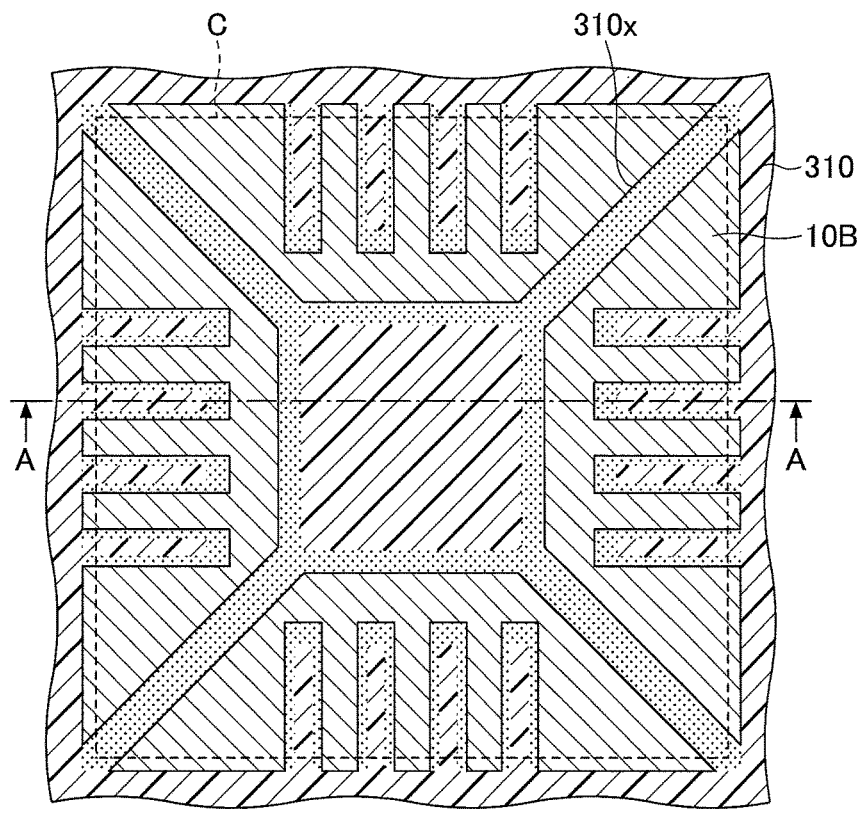
FIGS. 5A through 5D are diagrams depicting the process of manufacturing a semiconductor device according to the first embodiment.
Figure 5B:
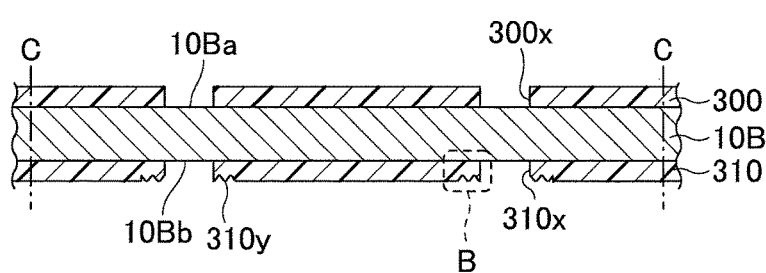
Figure 5C:
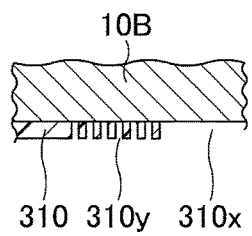
Figure 5D:
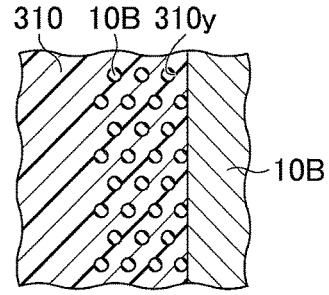
Figure 6A:
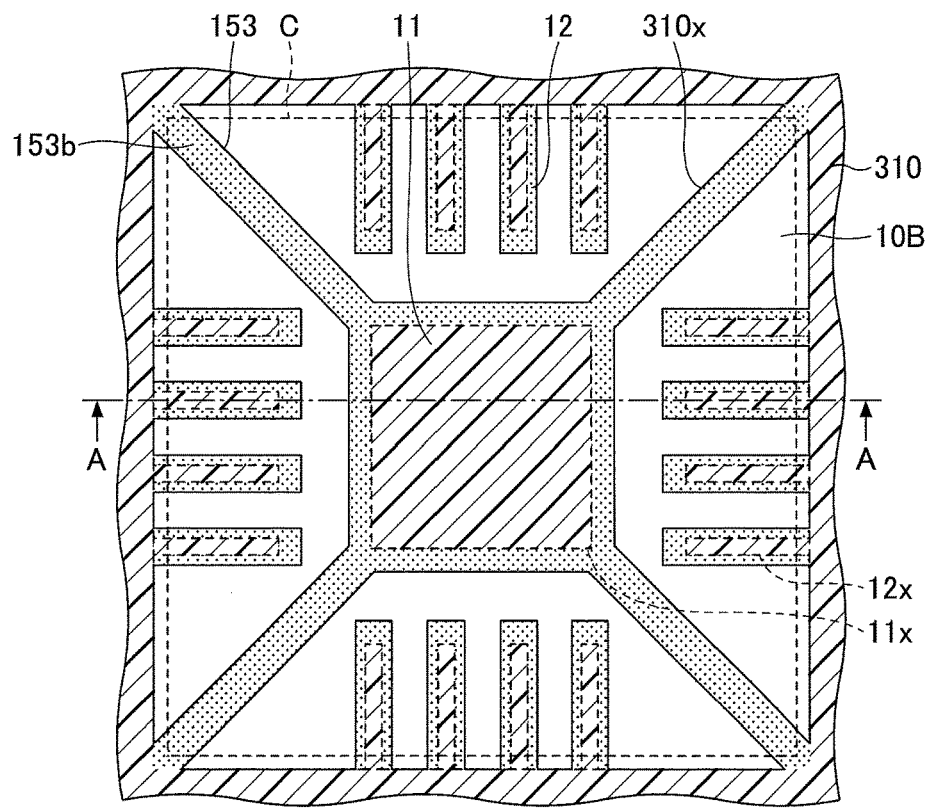
FIGS. 6A through 6D are diagrams depicting the process of manufacturing a semiconductor device according to the first embodiment.
Figure 6B:
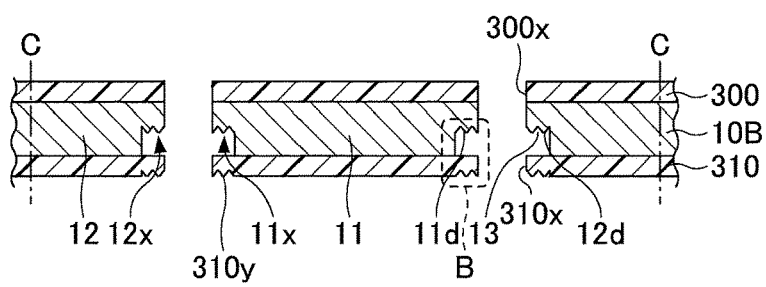
Figure 6C:
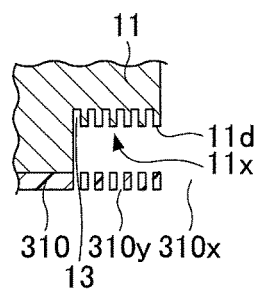
Figure 6D:
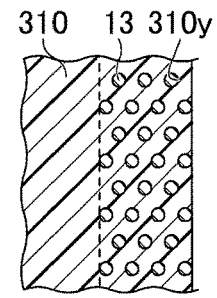
Figure 7A:
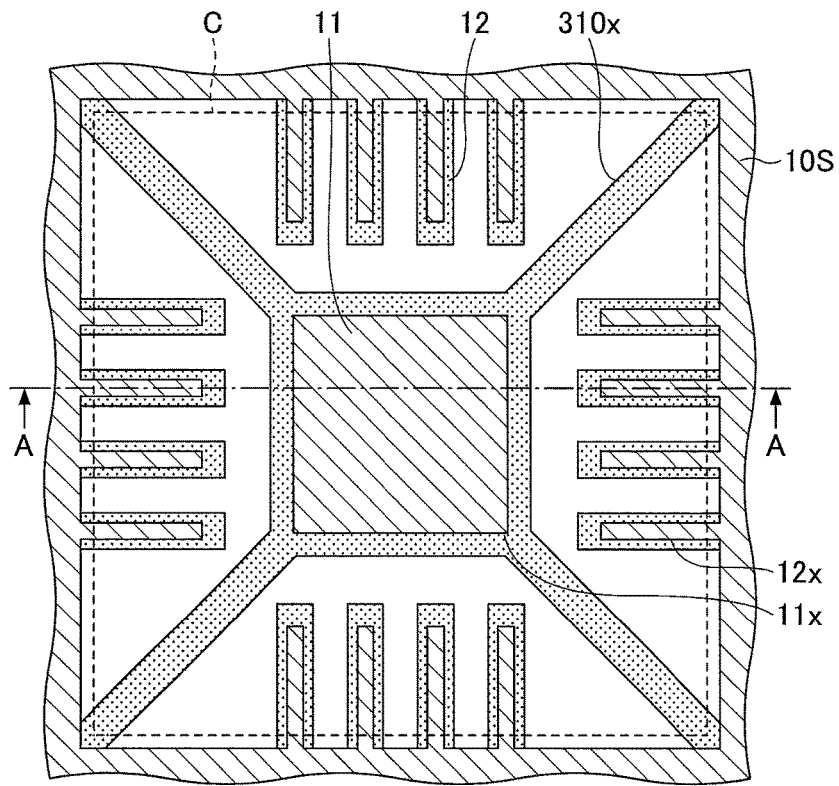
FIGS. 7A through 7D are diagrams depicting the process of manufacturing a semiconductor device according to the first embodiment.
Figure 7B:
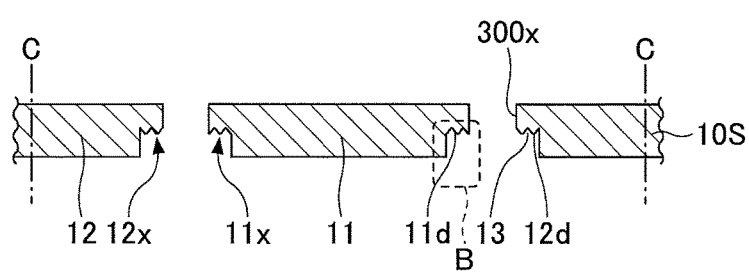
Figure 7C:
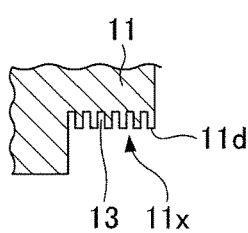
Figure 7D:
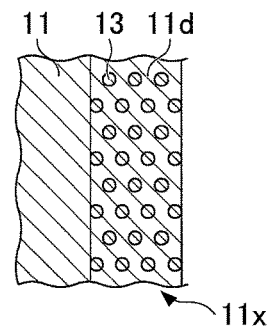

FIG. 5A is a bottom view of one of the individual regions C of FIGS. 4A and 4B. FIG. 5B is a cross-sectional view of one of the individual regions C, taken along a line A-A in FIG. 5A. FIG. 5C is an enlarged cross-sectional view of a part indicated by B ("part B") in FIG. 5B. FIG. 5D is an enlarged bottom view of part of the part B in FIG. 5B. The bottom views of FIGS. 5A and 5D are provided with hatching lines corresponding to those in the cross-sectional view of FIG. 5B to facilitate understanding of the drawings. Furthermore, a region in which the openings 310y for forming the uneven surface part 13 are provided is schematically indicated by a dotted pattern in FIG. 5A and by a corrugated line in FIG. 5B. The same is the case with FIGS. 6A, 6B, 6C and 6D and FIGS. 7A, 7B, 7C and 7D. The following description is given with respect to one of the individual regions C as a typical example of the individual regions C.

Next, in the process depicted in FIGS. 6A through 6D, the resists 300 and 310 are used as etching masks to perform etching (such as wet etching) on the plate 10B. Where the openings 300x and 310x are positioned one over the other in a plan view, the plate 10B is pierced through by the etching.

In a part of the plate 10B over which the openings 310y are formed, the plate 10B is partly prevented from being etched at the beginning of etching because the entry of an etchant is restricted around each circular opening (where the resist 310 is formed). Thereafter, from the middle to the end of etching, the etchant enters the plate 10B through the periphery of each opening to corrode the entire part of the plate 10B over which the openings 310y are formed. As a result, openings shallower at the peripheral edge than in the center are etched in the part of the plate 10B. The etched openings are depressions, depressed relative to their periphery, having a circular planar shape. As a result, the uneven surface part 13 is formed, and the entire part of the plate 10B over which the openings 310y are formed is reduced in thickness.

That is, the lower surfaces of a portion to become the stepped part 11x, a portion to become the stepped parts 12x, and a portion to become the support bars 153 of the plate 10B, over which the openings 310y are formed, are depressed relative to the lower surfaces of other parts of the plate 10B over which the openings 310y are not formed to form the stepped parts 11x and 12x and reduce the thickness of the plate 10B where the support bars 153 are formed. Furthermore, the uneven surface part 13 is formed in the lower surfaces (step surfaces 11d and 12d) of the stepped parts 11x and 12x and the lower surfaces 153b of the support bars 153. The step surface 11d of the stepped part 11x, the step surfaces 12d of the stepped parts 12x, and the lower surfaces 153b of the support bars 153 are covered regions to be covered with the resin 40.

One or more of the planar shape, the size, and the pitch of the openings 310y may be changed to vary the shape and the depth of the depressions of the uneven surface part 13. Furthermore, by changing one or more of the planar shape, the size, and the pitch of the openings 310y, the amount of etching changes, and therefore, the thickness of the step parts 11x and 12x and the support bars 153 can be reduced to a desired value.

Next, in the process depicted in FIGS. 7A through 7D, the resists 300 and 310 depicted in FIGS. 6A through 6D are removed. As a result, a leadframe 10S having a planar shape as depicted in FIG. 8A is obtained. FIG. 8A is a bottom view of the leadframe 10S. FIG. 8B is a cross-sectional view of the leadframe 10S, taken along a line A-A in FIG. 8A. According to the leadframe 10S depicted in FIGS. 8A and 8B, the individual regions C to become leadframes 10 are connected by a connecting part 15. The connecting part 15 includes an outer frame part 151, a dam bar 152, and the support bars 153. The outer frame part 151 has a frame shape and forms a peripheral edge portion of the leadframe 10S. The dam bar 152 has a grid shape and is connected to the outer frame part 151 to be positioned among the individual regions C within the outer frame part 151. The support bars 153 are diagonally arranged in each individual region C. Each support bar 153 has a first end connected to the outer frame part 151 and/or the dam bar 152 and has a second end connected to one of the four corners of the die pad 11 to support the die pad 11. The leads 12 extend from the outer frame part 151 or the dam bar 152 toward the die pad 11 to surround the die pad 11. According to QFN package-type semiconductor devices, the dam bar 152 may also be referred to as "connecting bar" or "sawing bar."

After the processes depicted in FIGS. 7A through 7D and FIGS. 8A and 8B, a desired portion of the leadframe 10S may be plated with a metal film such as a Ag film, a Au film, a Ni/Au film, or a Ni/Pd/Au film. Here, by way of example, the plating film 18 such as a sliver plating film is formed on the upper surface 12a of the lead 12 to improve wire bondability as depicted in FIG. 1B.

The description goes on to describe a process of manufacturing the semiconductor device 1. First, in the process depicted in FIG. 9A, the semiconductor chip 20 is mounted face up on the die pad 11 of each individual region C. The semiconductor chip 20 may be mounted on the die pad 11 through the adhesive 17 such as a die attach film. In this case, the die attach film is heated to a predetermined temperature to be hardened. As the adhesive 17, adhesive paste may be used in lieu of an adhesive film such as a die attach film.

Figure 9A:
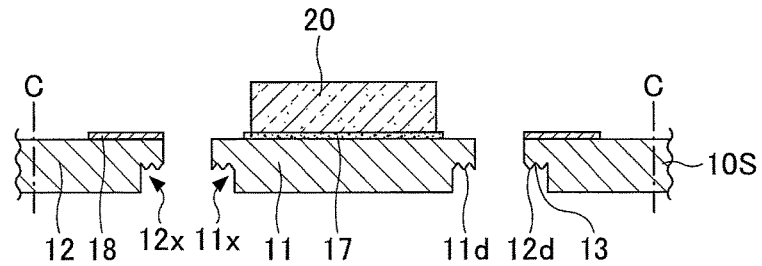
FIGS. 9A through 9C are diagrams depicting the process of manufacturing a semiconductor device according to the first embodiment.
Figure 9B:
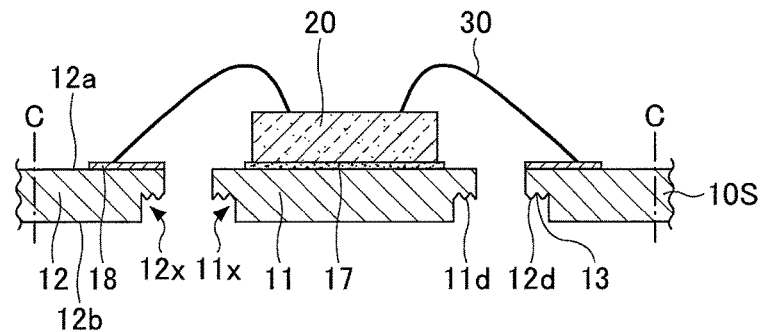

Next, in the process depicted in FIG. 9B, electrode terminals at the upper surface of the semiconductor chip 20 are electrically connected to the plating film 18 formed on the upper surfaces 12a of the leads 12 via the metal wires 30. The metal wires 30 may be connected to the electrode terminals of the semiconductor chip 20 and the plating film 18 by, for example, wire bonding.

Figure 9C:
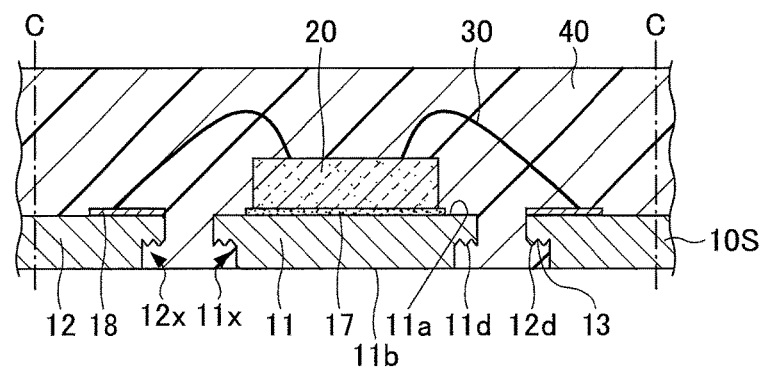

Next, in the process depicted in FIG. 9C, the leadframe 10S, the semiconductor chip 20, and the metal wires 30 are encapsulated in the resin 40 by, for example, transfer molding or compression molding. The resin 40 may be, for example, a so-called mold resin that is epoxy resin containing a filler.

A protection tape or the like is applied to the lower surface of the leadframe 10S to prevent the resin 40 from extending over to the lower surface of the leadframe 10S when the leadframe 10S is encapsulated in the resin 40. Because the uneven surface part 13 is not formed in the lower surface of the leadframe 10S, a protection tape or the like can be applied without a gap to the lower surface of the leadframe 10S to ensure prevention of extension of the resin 40.

In view of ensuring application of a protection film or the like, for example, only a peripheral edge of the lower surface 11b of the die pad 11 may be made flat, and the uneven surface part 13 may be formed in a region surrounded by the peripheral edge in the lower surface 11b. In this case, when the semiconductor device is completed and packaged, the adhesion between the lower surface 11b of the die pad 11 and a bonding material, such as solder, provided on the lower surface 11b of the die pad 11 increases.

Thereafter, the structure depicted in FIG. 9C is cut along scribe lines into the individual regions C to complete semiconductor devices 1 (see FIGS. 1A through 1D). A slicer or the like may be used to cut the structure depicted in FIG. 9C.

The semiconductor devices 1 may be shipped as individual products. Alternatively, the leadframe 10S before singulation as depicted in FIGS. 8A and 8B may be shipped as a single product. In this case, a person who acquires the leadframe 10S before singulation may execute the processes depicted in FIGS. 9A through 9C to manufacture the semiconductor devices 1.

Thus, according to the manufacturing process of the leadframe 10S, a predetermined pattern for forming the uneven surface part 13 is formed in an etching mask that is used to etch a plate to form the die pads 11, the leads 12, and the support bars 153. Therefore, it is possible to form the stepped parts 11x and 12x, reduce the thickness of the support bars 153, and form the uneven surface part 13 in the lower surfaces of the stepped parts 11x and 12x and the support bars 153 in the same process as the die pads 11, the leads 12, and the support bars 153 are formed. Accordingly, it is possible to streamline the manufacturing process and reduce the manufacturing cost.

Furthermore, it is possible to simultaneously form the die pads 11, the leads 12, the support bars 153, the stepped parts 11x and 12x, and the uneven surface part 13 using a single etching mask. Accordingly, in principle, there is no misplacement of these elements relative to one another. Accordingly, it is possible to form the uneven surface part 13 at desired positions on the stepped parts 11x and 12x and the support bars 153.

According to a conventional technique that performs etching for surface roughening (such as oxidation, roughening plating, or roughening etching) separately from etching for forming the die pads 11, the leads 12, and the support bars 153, the manufacturing process becomes complicated to increase cost. Furthermore, in the case of performing partial roughening, a roughening area to be roughened is limited by masking or the like. In this case, however, the misalignment of the leadframe formed by etching and a mask for roughening is inevitable. Accordingly, the position accuracy of the roughening area deteriorates.

Figure 23:
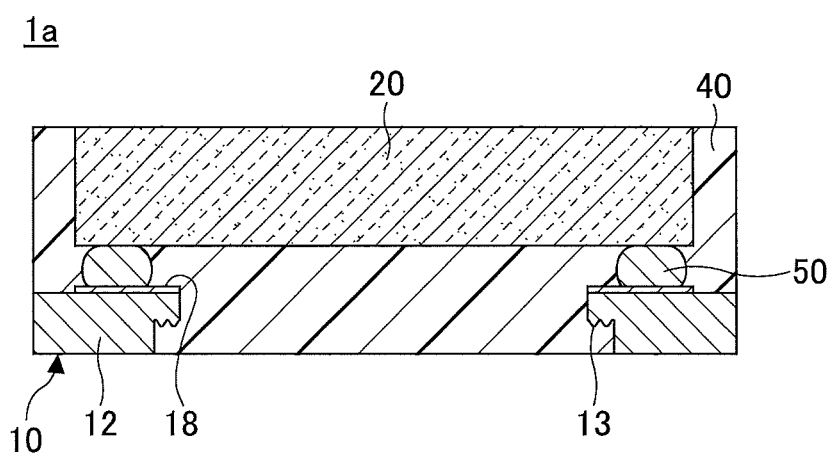
FIG. 23 is a cross-sectional view of another semiconductor device according to the first embodiment.

Another example of the semiconductor device according to the first embodiment is described below. FIG. 23 is a cross-sectional view of another semiconductor device. A semiconductor device 1a depicted in FIG. 23 includes the leads 12 but has no die pad or support bars. The semiconductor chip 20 is connected face down (by flip chip bonding) onto the leadframe 10 so that the electrode terminals of the semiconductor chip 20 are connected to the upper surfaces 12a of the leads 12 via connection terminals 50 (connecting members) such as solder bumps, gold bumps or copper bumps. The plating film 18 is provided on the upper surfaces 12a of the leads 12 where the connection terminals 50 are provided. As described above, the plating film 18 may be formed on an as-needed basis and be omitted. In this case, the rear surface (upper surface in FIG. 23) of the semiconductor chip 20 may be exposed at the upper surface of the resin 40 to reduce the thickness of the semiconductor device 1a and to increase the heat dissipation of the semiconductor chip 20. The rear surface of the semiconductor chip 20, however, may be covered with the resin 40.

The leadframe 10 of the semiconductor device 1a depicted in FIG. 23 may be formed by removing the die pad 11 and the support bars 153 from the leadframe 10S depicted in FIGS. 8A and 8B. Specifically, in the process depicted in FIGS. 5A through 5D, the resists 300 and 310 may be formed to expose a portion of the plate 10B to become the die pad 11 and the support bars 153. Then, etching may be performed with the resists 300 and 310 for forming only the leads 12 the same as in the process depicted in FIGS. 6A through 6D. Thereafter, the resists 300 and 310 are removed the same as in the process depicted in FIGS. 7A through 7D. Then, the semiconductor chip 20 is mounted face down on the upper surfaces 12a of the leads 12 through the connection terminals 50 by flip chip bonding. Then, the leadframe 10S, the semiconductor chip 20, and the connection terminals 50 are encapsulated in the resin 40 the same as in the process depicted in FIG. 9C to complete the semiconductor device 1a that includes the leads 12 but has no die pad or support bars as depicted in FIG. 23.

[b] Second Embodiment

According to a second embodiment, an uneven surface part is formed in an upper surface of a die pad, etc. In the second embodiment, a description of the same configurations as those of the above-described embodiment may be omitted.

Figure 10A:
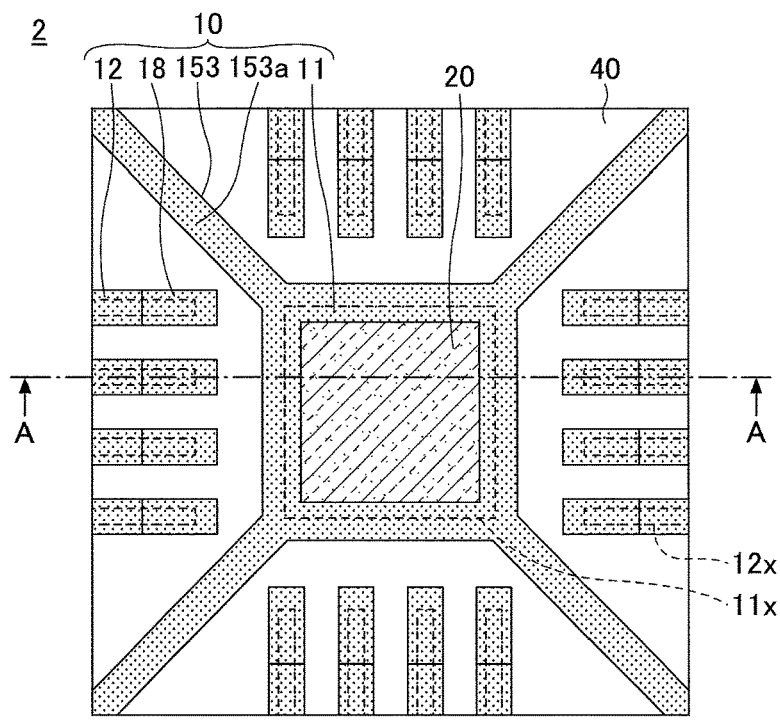
FIGS. 10A through 10D are diagrams depicting a semiconductor device according to a second embodiment.
Figure 10B:
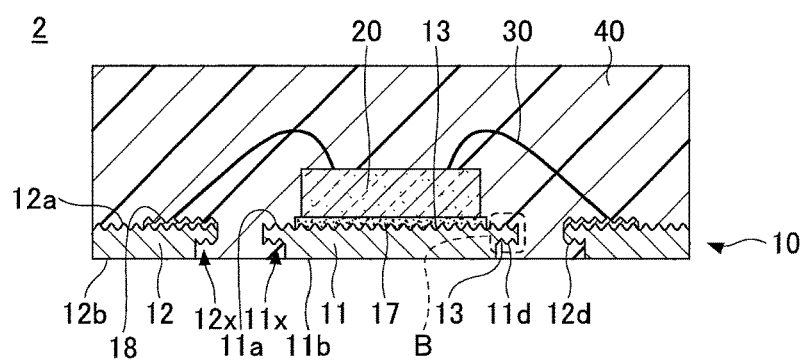
Figure 10C:
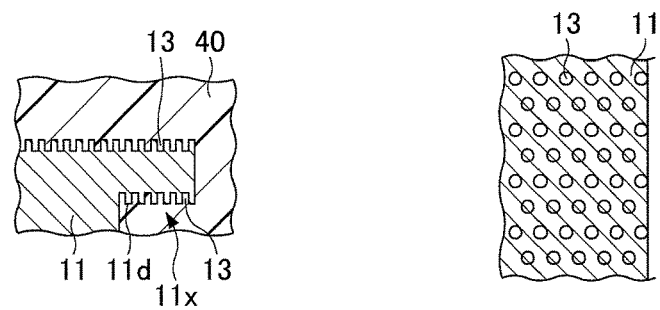
Figure 10D:
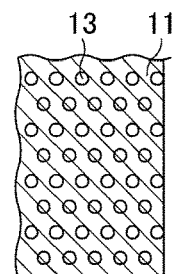

First, a structure of a semiconductor device according to the second embodiment is described. FIG. 10A is a plan view of a semiconductor device according to the second embodiment. FIG. 10B is a cross-sectional view of the semiconductor device, taken along a line A-A in FIG. 10A. FIG. 10O is an enlarged cross-sectional view of a part indicated by B ("part B") in FIG. 10B. FIG. 10D is an enlarged plan view of part of the part B in FIG. 10B. In FIG. 10A, the adhesive 17, the metal wires 30, and the resin 40 are not depicted for clarity, and hatching lines corresponding to those in the cross-sectional view of FIG. 10B are provided. In FIG. 10D, the resin 40 is not depicted for clarity.

Referring to FIGS. 10A through 10D, a semiconductor device 2 of the second embodiment is different from the semiconductor device 1 (see FIGS. 1A through 1D) in that the die pad 11, the lead 12, and the support bar 153 are reduced in thickness on their upper side and that the uneven surface part 13 is formed in the upper surface 11a of the die pad 11, the upper surface 12a of the lead 12, and an upper surface 153a of the support bar 153. A region in which the uneven surface part 13 is provided is schematically indicated by a dotted pattern in FIG. 10A and by a corrugated line in FIG. 10B.

The uneven surface part 13 is thus provided in the upper surface 11a of the die pad 11, the upper surface 12a of the lead 12, and the upper surface 153a of the support bar 153 to increase the surface area of the contact (interface) between the resin 40 and each of the upper surface 11a of the die pad 11, the upper surface 12a of the lead 12, and the upper surface 153a of the support bar 153. Therefore, an anchoring effect is produced to make it possible to increase the adhesion between the leadframe 10 and the resin 40. As a result, it is possible to prevent delamination of the leadframe 10 and the resin 40 at their interface.

Furthermore, the uneven surface part 13 is provided in the upper surface 11a of the die pad 11 to make it possible to increase the bonding strength of the semiconductor chip 20 bonded onto the upper surface 11a of the die pad 11 with the adhesive 17 through the anchoring effect of the adhesive 17. The effects due to the provision of the uneven surface part 13 in the step surfaces 11d and 12d are the same as in the first embodiment.

As in the first embodiment, the plating film 18 such as a silver plating film is formed in the upper surface 12a of the lead 12 to improve wire bondability. The formation of a silver plating film, which is normally approximately 2 μm to approximately 6 μm in thickness, does not flatten the uneven surface part 13, and the S ratio of the uneven surface part 13 remains substantially the same after the formation of a silver plating film. Therefore, it is possible to improve the adhesion between the lead 12 and the resin 40 even with the plating film 18 formed on the upper surface 12a of the lead 12.

Depending on the condition of connection (the condition of wire bonding) to the metal wire 30, however, it may be preferable to omit the uneven surface part 13. In this case, the uneven surface part 13 may be formed in a region other than the region of the upper surface 12a of the lead 12 that is connected to the metal wire 30.

Next, a method of manufacturing a semiconductor device according to the second embodiment is described. FIGS. 11A through 14B are diagrams depicting a process of manufacturing a semiconductor device according to the second embodiment.

Figure 11A:
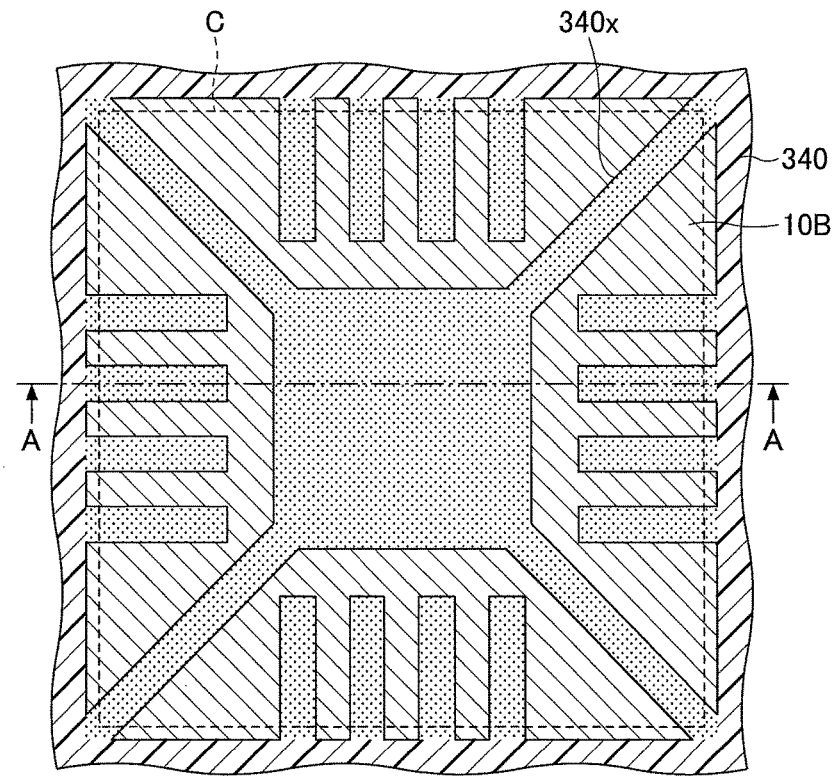
FIGS. 11A through 11D are diagrams depicting a process of manufacturing a semiconductor device according to the second embodiment.
Figure 11B:
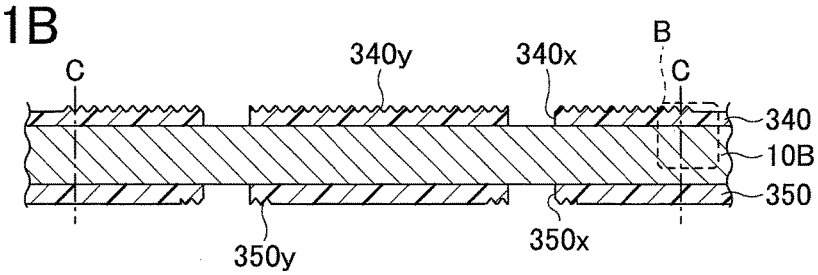
Figure 11C:
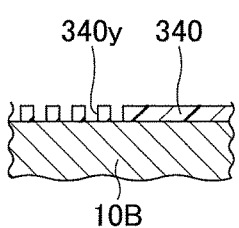
Figure 11D:
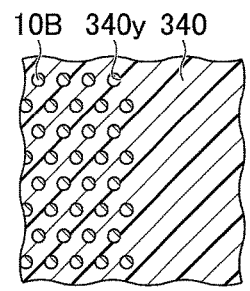
Figure 12A:
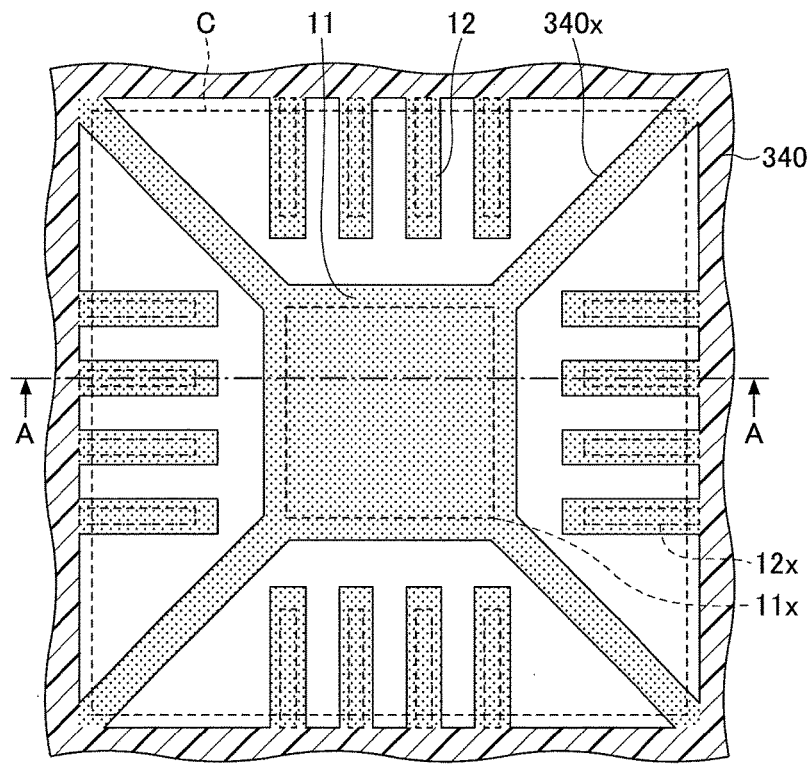
FIGS. 12A through 12D are diagrams depicting the process of manufacturing a semiconductor device according to the second embodiment.
Figure 12B:
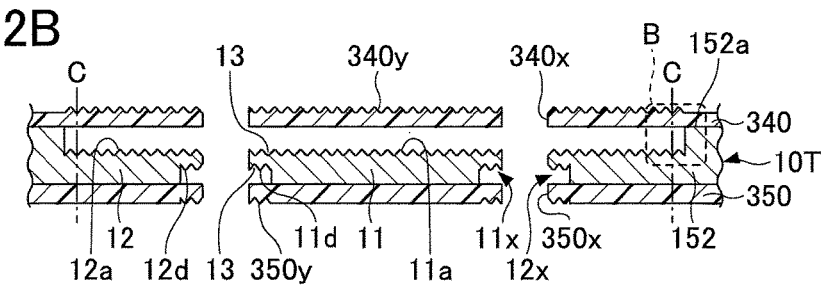
Figure 12C:
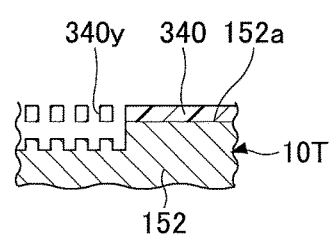
Figure 12D:
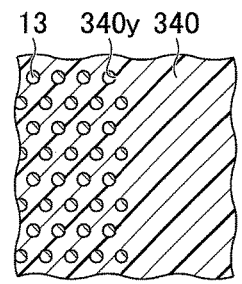
Figure 13A:
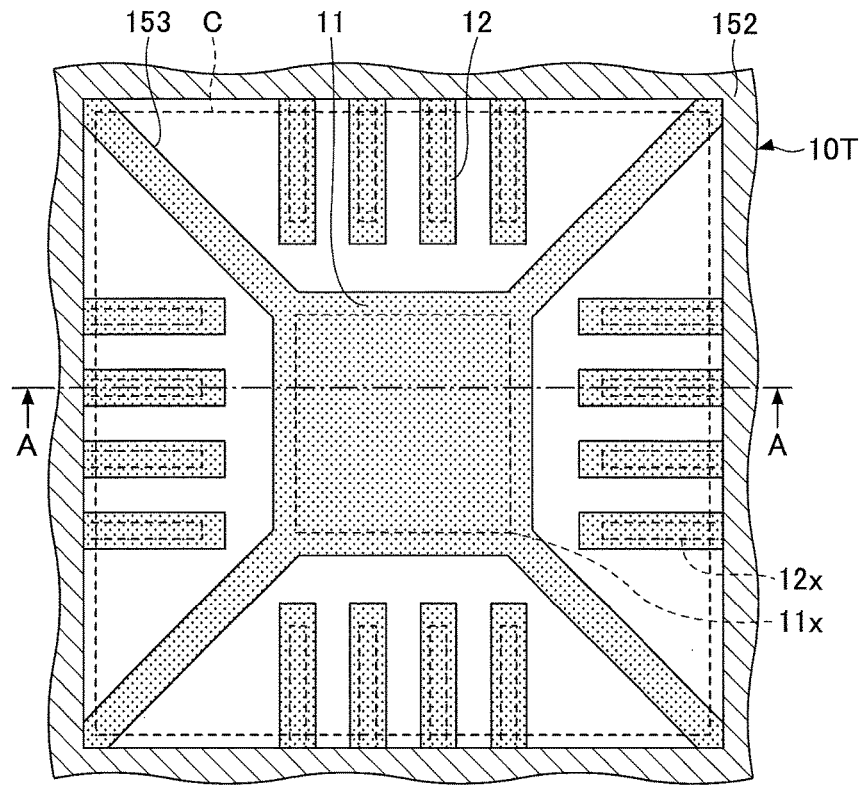
FIGS. 13A through 13D are diagrams depicting the process of manufacturing a semiconductor device according to the second embodiment.
Figure 13B:
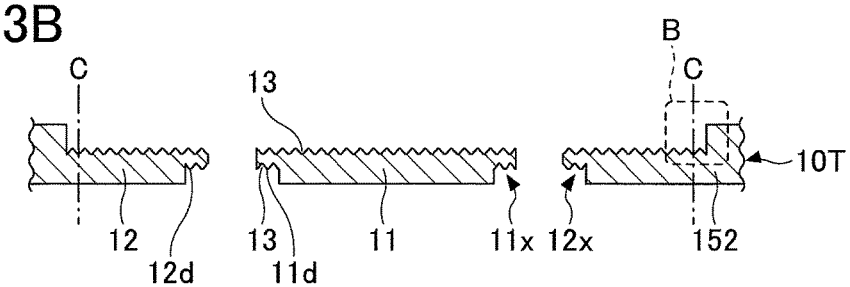
Figure 13C:
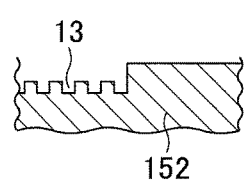
Figure 13D:
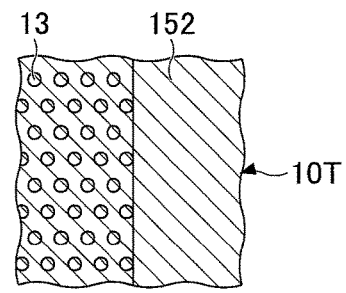

FIG. 11A is a plan view of one of the individual regions C of FIGS. 4A and 4B. FIG. 11B is a cross-sectional view of one of the individual regions C, taken along a line A-A in FIG. 11A. FIG. 11C is an enlarged cross-sectional view of part indicated by B ("part B") in FIG. 11B. FIG. 11D is an enlarged plan view of part of the part B in FIG. 11B. The plan views of FIGS. 11A and 11D are provided with hatching lines corresponding to those in the cross-sectional view of FIG. 11B to facilitate understanding of the drawings. A region in which openings 340y or 350y for forming the uneven surface part 13 are provided is schematically indicated by a dotted pattern in FIG. 11A and by a corrugated line in FIG. 11B. The same is the case with FIGS. 12A, 12B, 12C and 12D and FIGS. 13A, 13B, 13C and 13D.

First, in the process depicted in FIGS. 11A through 11D, the metal plate 10B having a predetermined shape as depicted in FIGS. 4A and 4B is prepared, and a photoresist 340 ("resist 340") and a photoresist 350 ("resist 350") are formed on the upper surface and the lower surface, respectively, of the plate 10B. Then, the resists 340 and 350 are exposed to light and developed to form openings 340x and the openings 340y at predetermined positions in the resist 340 and openings 350x and the openings 350y at predetermined positions in the resist 350.

The openings 340x and 350x are openings for forming the die pads 11, the leads 12, and the support bars 153 in the plate 10B, and are positioned one over the other in a plan view. The openings 340y are openings for forming the uneven surface part 13 and reducing the thickness of the plate 10B on its upper side, and are provided on upper surfaces of portions of the plate 10B to become the die pads 11, the leads 12, and the support bars 153. The openings 350y are openings for forming the uneven surface part 13 and reducing the thickness of the plate 10B on its lower side, and are provided where the step parts 11x and 12x are to be formed and where the support bars 153 are to be formed.

The openings 340y and 350y are, for example, multiple circular openings that are vertically and laterally arranged. The diameter of the circular openings is preferably 0.020 mm to 0.060 mm, and more preferably, 0.020 mm to 0.040 mm. The pitch of the circular openings is preferably 0.040 mm to 0.080 mm. The planar shape of the openings 340y and 350y is not limited to a circle, and may be, for example, a polygon such as a hexagon. In this case, the diameter of the circumcircle of a polygon is preferably 0.020 mm to 0.060 mm, and more preferably, 0.020 mm to 0.040 mm.

Thus, the resist 340 is formed to cover upper surfaces of portions of the plate 10B to become the die pads 11, the leads 12, and the support bars 153 and upper surfaces of portions of the plate 10B to become the outer frame part 151 and the dam bar 152. The openings 340y are formed in a region of the resist 340 that covers the upper surfaces of the portions to become the die pads 11, the leads 12, and the support bars 153.

Furthermore, the resist 350 is formed to cover lower surfaces of the portions to become the die pads 11, the leads 12, and the support bars 153 and lower surfaces of the portions to become the outer frame part 151 and the dam bar 152. The openings 350y are formed in a region of the resist 350 that covers the lower surfaces of the portions to become the step parts 11x, the step parts 12x, and the support bars 153.

Next, in the process depicted in FIGS. 12A through 12D, the resists 340 and 350 are used as etching masks to perform etching (such as wet etching) on the plate 10B. Where the openings 340x and 350x are positioned one over the other in a plan view, the plate 10B is pierced through.

Furthermore, in a portion of the plate 10B over which the openings 340y are formed, the uneven surface part 13 is formed, and the thickness is reduced. That is, the upper surfaces 11a of the die pads 11, the upper surfaces 12a of the leads 12, and the upper surfaces 153a of the support bars 153, over which the openings 340y are formed, are depressed relative to an upper surface 151a (FIG. 14B) of the outer frame part 151 and an upper surface 152a of the dam bar 152, over which no openings are formed. Thus, the plate 10B is reduced in thickness where the die pads 11, the leads 12, and the support bars 153 are formed.

Furthermore, in a part of the plate 10B where the openings 350y are formed, the uneven surface part 13 is formed, and the thickness is reduced. That is, the lower surfaces (step surfaces 11d and 12d) of the step parts 11x and 12x and the lower surfaces (not depicted) of the support bars 153, over which the openings 350y are formed, are depressed relative to lower surfaces of parts of the plate 10B over which no openings are formed. Thus, the step parts 11x and 12x are formed and the plate 10B is reduced in thickness where the support bars 153 are formed, and the uneven surface part 13 is formed in the step surfaces 11d and 12d of the step parts 11x and 12x and the lower surfaces (not depicted) of the support bars 153.

One or more of the planar shape, the size, and the pitch of the openings 340y and 350y may be changed to vary the shape and the depth of the depressions of the uneven surface part 13. Furthermore, by changing one or more of the planar shape, the size, and the pitch of the openings 340y and 350y, the amount of etching changes, and therefore, the thickness of the die pads 11, the leads 12, the step parts 11x and 12x, and the support bars 153 can be reduced to a desired value.

Next, in the process depicted in FIGS. 13A through 13D, the resists 340 and 350 depicted in FIGS. 12A through 12D are removed. As a result, a leadframe 10T as depicted in FIGS. 14A and 14B is completed. According to the leadframe 10T, the upper surface 151a of the outer frame part 151 and the upper surface 152a of the dam bar 152 are in the same plane. The upper surfaces 11a of the die pads 11, the upper surfaces 12a of the leads 12, and the upper surfaces 153a of the support bars 153 are in the same plane. The lower surfaces (step surfaces 11d and 12d) of the step parts 11x and 12x and the lower surfaces (not depicted) of the support bars 153 are in the same plane. A lower surface 151b of the outer frame part 151, a lower surface 152b of the dam bar 152, the lower surfaces 11b of the die pads 11, and the lower surfaces 12b of the leads 12 are in the same plane.

Furthermore, the interval (depth) from the upper surface 151a of the outer frame part 151 and the upper surface 152a of the dam bar 152 to the upper surfaces 11a of the die pads 11, the upper surfaces 12a of the leads 12, and the upper surfaces 153a of the support bars 153 is greater than the interval (depth) from the lower surfaces (step surfaces 11d and 12d) of the step parts 11x and 12x and the lower surfaces (not depicted) of the support bars 153 to the lower surface 151b of the outer frame part 151, the lower surface 152b of the dam bar 152, the lower surfaces 11b of the die pads 11, and the lower surfaces 12b of the leads 12. The thickness of the step parts 11x and 12x and the support bars 153 is smaller than the thickness of the die pads 11 and the leads 12.

Thus, of the leadframe 10T according to the second embodiment, a non-product portion, or a portion to be ultimately removed and not to become products (semiconductor devices), is thicker than a product portion, or a portion to ultimately become products (semiconductor devices). Thus, according to the leadframe 10T of the first embodiment, it is possible to reduce the thickness of the product portion while maintaining high stiffness. As a result, semiconductor devices, which are final products, can be reduced in thickness.

Furthermore, a technique to complicate the shape of a leadframe or change the material of a leadframe to a harder material is not employed to maintain the stiffness of the leadframe 10T, thus exerting no influence over the performance of the completed semiconductor devices.

Furthermore, according to the leadframe 10T of the second embodiment, it is possible to reduce the thickness of the product portion as desired. Accordingly, it is possible to manufacture semiconductor devices with a leadframe whose thickness is not commercially common.

According to this embodiment, the outer frame part 151 and the dam bar 152 are the non-product portion, and the die pads 11, the leads 12, and the support bars 153 are the product portion.

Thereafter, the same processes as depicted in FIGS. 9A through 9C are executed to cut the manufactured structure along scribe lines into the individual regions C, using, for example, a slicer, to complete multiple semiconductor devices 2 (see FIGS. 10A through 10D).

Figure 15A:
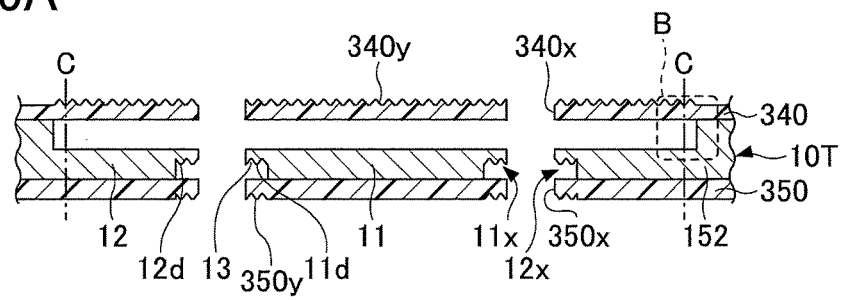
FIGS. 15A and 15B are diagrams depicting a process of manufacturing a semiconductor device according to a first variation of the second embodiment.
Figure 15B:
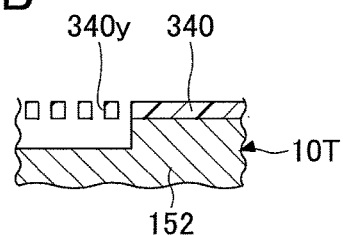
Figure 16A:
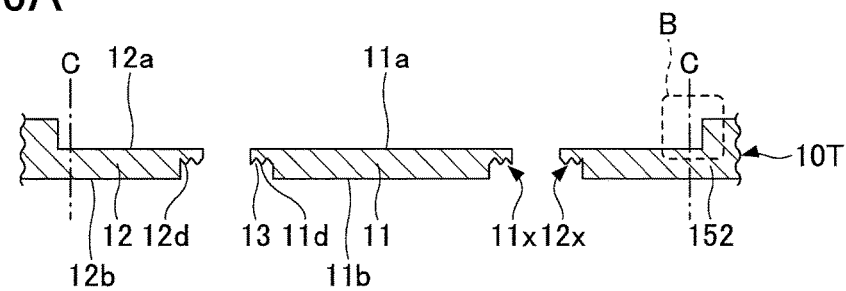
FIGS. 16A and 16B are diagrams depicting the process of manufacturing a semiconductor device according to the first variation of the second embodiment.
Figure 16B:
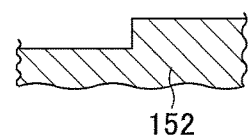

As a first variation of the above-described process, the processes depicted in FIGS. 12A through 13D may be replaced with the processes depicted in FIGS. 15A through 16B. FIG. 15A is a cross-sectional view of one of the individual regions C. FIG. 15B is an enlarged cross-sectional view of a part indicated by B in FIG. 15A. FIG. 16A is a cross-sectional view of one of the individual regions C. FIG. 16B is an enlarged cross-sectional view of a part indicated by B in FIG. 16A. That is, by changing one or more of the planar shape, the size, and the pitch of the openings 340y as depicted in FIGS. 15A and 15B, the upper surfaces 11a of the die pads 11, the upper surfaces 12a of the leads 12, and the upper surfaces (not depicted) of the support bars 153 can be formed flat by half-etching. That is, it is possible to perform half-etching without forming the uneven surface part 13. For example, it is possible to form a flat half-etched surface by forming the openings 340y with one of various kinds of patterns and selecting a pitch and a size for the one of various kinds of patterns. The various kinds of patterns include, for example, a circular pattern and a polygonal patter for the shape of the individual openings 340y and a checkered pattern for the arrangement of the openings 340y.

Figure 17A:
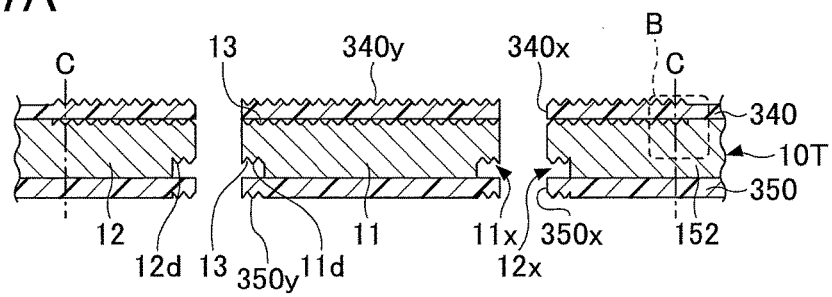
FIGS. 17A and 17B are diagrams depicting a process of manufacturing a semiconductor device according to a second variation of the second embodiment.
Figure 17B:
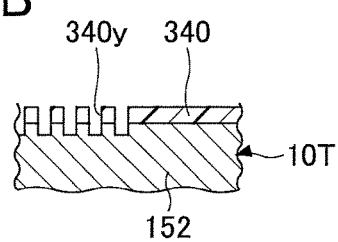
Figure 18A:
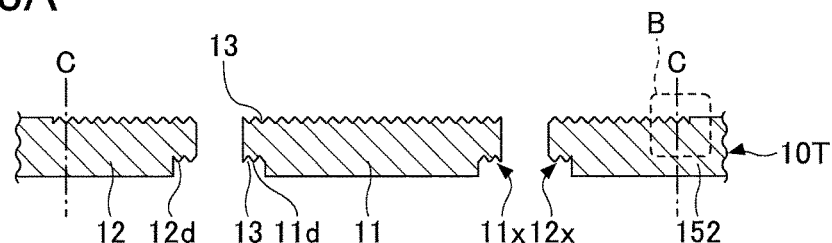
FIGS. 18A and 18B are diagrams depicting the process of manufacturing a semiconductor device according to the second variation of the second embodiment.
Figure 18B:
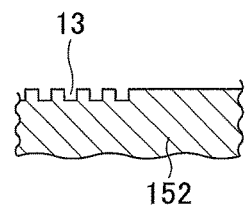

Furthermore, as a second variation of the above-described process, the processes depicted in FIGS. 12A through 13D may be replaced with the processes depicted in FIGS. 17A through 18B. FIG. 17A is a cross-sectional view of one of the individual regions C. FIG. 17B is an enlarged cross-sectional view of a part indicated by B in FIG. 17A. FIG. 18A is a cross-sectional view of one of the individual regions C. FIG. 18B is an enlarged cross-sectional view of a part indicated by B in FIG. 18A. That is, the pitch of the openings 340y may be increased as depicted in FIGS. 17A and 17B to form the uneven surface part 13 in the upper surfaces 11a of the die pads 11, the upper surfaces 12a of the leads 12, and the upper surfaces (not depicted) of the support bars 153 while partly keeping the initial plate thickness as depicted in FIGS. 18A and 18B.

Example 1

Figure 19A:
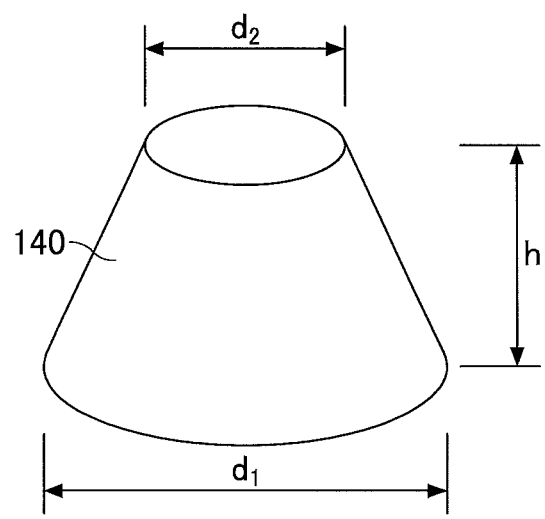
FIGS. 19A and 19B are diagrams depicting a test sample for a cup shear test.
Figure 19B:
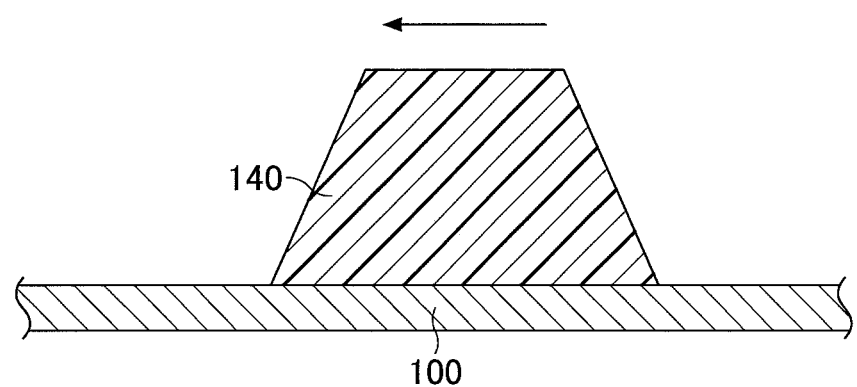

First, test samples as depicted in FIGS. 19A and 19B were made. Specifically, an uneven surface part including depressions each having a planar shape of a circle more than or equal to 0.020 mm and less than or equal to 0.060 mm in diameter was formed in an upper surface of a leadframe material 100 that is a flat metal plate formed of copper. A resin cup 140 was then formed on the uneven surface part under the conditions of formation indicated in TABLE 1 below without plating a surface of the uneven surface part. With respect to each of six S ratios, six test samples were made, and a measurement was conducted six times. An S ratio of 1 indicates test samples without an uneven surface part (conventional products serving as a comparative example). In determining an S ratio, a surface area was measured using a laser confocal microscope (LEXT OLS4100, a product of OLYMPUS CORPORATION).

TABLE 1

| RESIN TYPE | EPOXY RESIN |
| --- | --- |
| HEIGHT h | 3 mm |
| BOTTOM DIAMETER d1 | 3.568 mm |
| TOP DIAMETER d2 | 3 mm |
| SURFACE AREA | 10.2 mm² |
| THERMAL HISTORY | 175° C. × 1 h (N₂) + 230° C. × 10 min. (AIR) |
| RESIN CURING CONDITION | 175° C. × 6 h (AIR) |

As indicated in TABLE 1, the test samples were heated at 175° C. for 1 hour in a nitrogen atmosphere, and were thereafter heated at 230° C. for 10 minutes in the air as a thermal history. The thermal history assumes heating in a semiconductor chip mounting process (die attach process) and a wire bonding process performed before encapsulating a semiconductor chip, etc., in resin during a manufacturing process from the manufacture of a leadframe to the manufacture of a semiconductor device.

That is, the leadframe is oxidized to no small extent by heating in these processes to affect the adhesive force between resin and the leadframe. Therefore, in this test as well, the resin cup 140 was formed after adding a thermal history corresponding to heating in the actual die attach process and wiring bonding process to the leadframe materials 100 of the test samples. As a result, it is possible to obtain highly reliable test results.

Next, a cup shear test was conducted following the procedure provided by the SEMI G69-0996 standard. Specifically, a gauge (not depicted) was pressed against the resin cup 140 of each test sample to be moved in the direction of an arrow in FIG. 19B to measure the shear strength. The test was conducted at room temperature (approximately 25° C.). The height of the gauge was 20 μm and the speed of the gauge was 200 μm/s.

Figure 20:
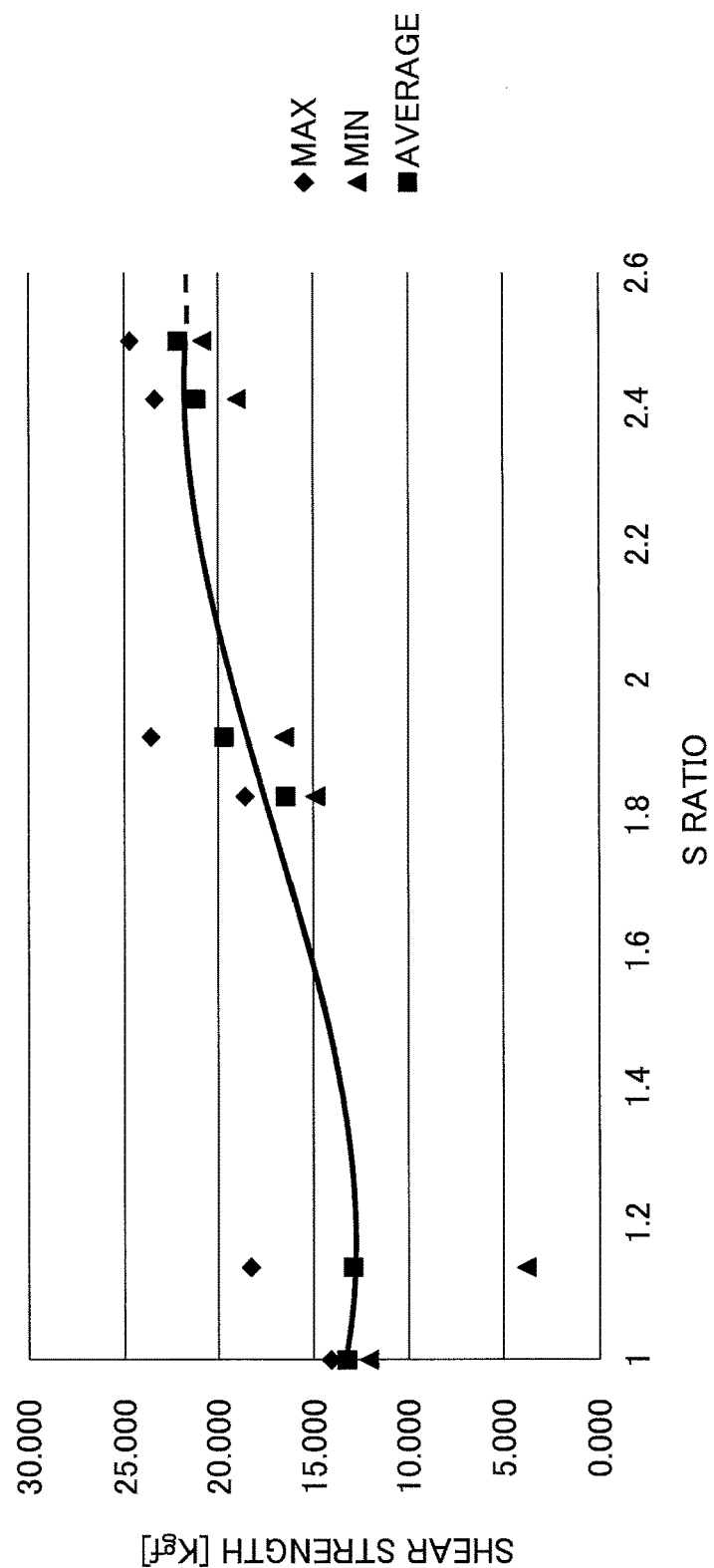
FIG. 20 is a graph indicating the results of a cup shear test according to Example 1.

FIG. 20 indicates the test results. Referring to FIG. 20, while the shear strength of the test samples (S ratio=1) of the comparative example is approximately 13 [Kgf] on average, the shear strength of the test samples having an S ratio of 1.8 or more is 17 [Kgf] or more on average. That is, it has been found that the adhesion between the leadframe and resin significantly increases compared with the conventional products when the S ratio is 1.8 or more. When the S ratio is approximately 2.5, an increase in the shear strength saturates. This is because part of the resin comes off (breaks) before delamination of the leadframe and the resin at their interface.

Example 2

The same uneven surface part as in Example 1 was formed in the upper surface of the copper leadframe material 100, and a cup shear test was conducted in the same manner as in Example 1 except that the surface of the uneven surface part was plated with silver and the resin cup 140 was formed on the silver-plated uneven surface part. The thickness of the silver plating film was approximately 6 μm.

Figure 21:
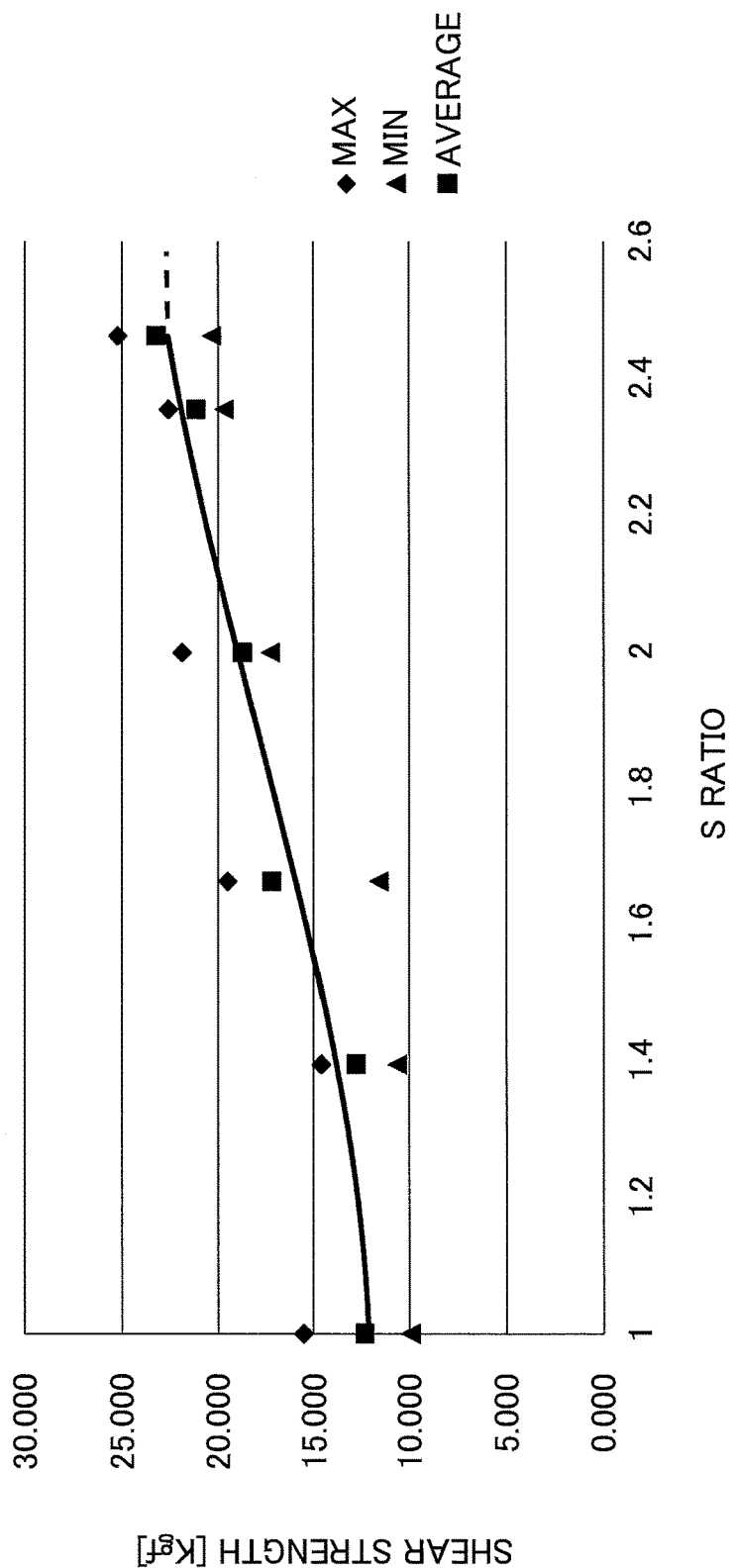
FIG. 21 is a graph indicating the results of a cup shear test according to Example 2.

FIG. 21 indicates the test results. Referring to FIG. 21, while the shear strength of the test samples (S ratio=1) of the comparative example is approximately 13 [Kgf] on average, the shear strength of the test samples having an S ratio of 1.7 or more is 17 [Kgf] or more on average. That is, it has been found that the adhesion between the sliver plating film formed on the leadframe and resin significantly increases compared with the conventional products when the S ratio is 1.7 or more.

Example 3

The same uneven surface part as in Example 1 was formed in the upper surface of the copper leadframe material 100, and a cup shear test was conducted in the same manner as in Example 1 except that the surface of the uneven surface part was plated with Ni/Pd/Au and the resin cup 140 was formed on the Ni/Pd/Au-plated uneven surface part.

The Ni/Pd/Au plating is a laminate of a Ni plating film, a Pd plating film, and a Au plating film stacked on the upper surface of the leadframe material 100 in this order. According to Example 3, the thickness of the Ni plating film was approximately 0.8 μm, the thickness of the Pd plating film was approximately 0.03 μm, and the thickness of the Au plating film was approximately, 0.006 μm.

Figure 22:
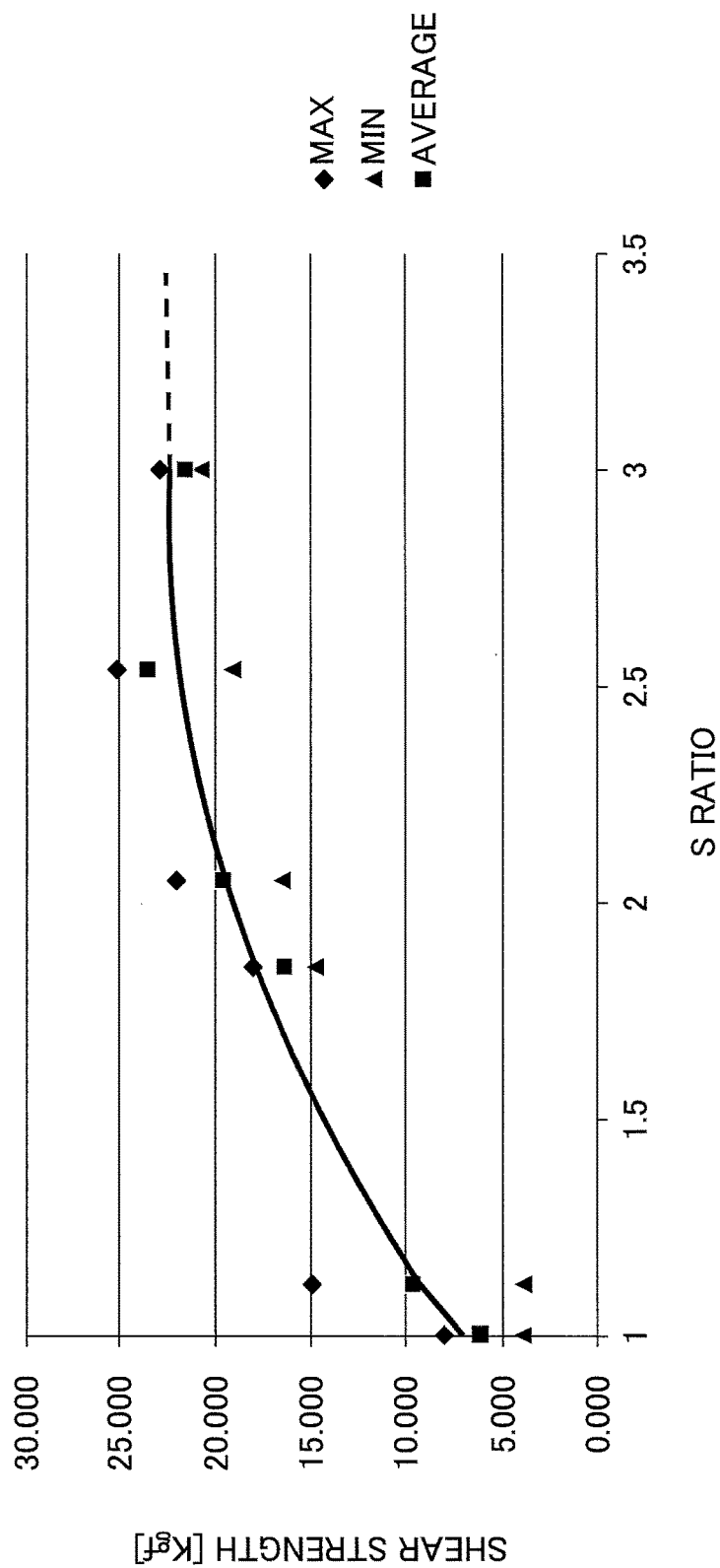
FIG. 22 is a graph indicating the results of a cup shear test according to Example 3.

FIG. 22 indicates the test results. Referring to FIG. 22, while the shear strength of the test samples (S ratio=1) of the comparative example is approximately 6 [Kgf] on average, the shear strength of the test samples having an S ratio of 1.8 or more is 17 [Kgf] or more on average. That is, it has been found that the adhesion between the Ni/Pd/Au plating film formed on the leadframe and resin significantly increases compared with the conventional products when the S ratio is 1.8 or more.

[Summary of Examples]

By forming an uneven surface part that includes depressions having a planar shape of a circle more than or equal to 0.020 mm and less than or equal to 0.060 mm in diameter to have an S ratio of 1.7 or more in an upper surface of a copper leadframe, the surface area of a part of the leadframe that contacts resin increases. Therefore, the anchoring effect is produced to make it possible to increase the adhesion between the leadframe and resin.

Furthermore, the uneven surface part can maintain the S ratio at a certain level or higher even after being plated with silver or Ni/Pd/Au. Therefore, even in the case of providing resin on the plated surface of the leadframe, it is possible to increase the adhesion between the leadframe and resin.

A range of S ratios suitable for practical use is from approximately 1.7 to approximately 2.5. In view of the adhesion increasing effect and the saturation of an increase in adhesion, a more suitable range of S ratios is from approximately 1.8 to approximately 2.0.

The same effect has been confirmed with the case where the planar shape of depressions in the uneven surface part is a polygon whose circumcircle has a diameter of greater than or equal to 0.020 mm and smaller than or equal to 0.060 mm.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, according to the above-described embodiments, multiple individual regions are arranged in a matrix in a leadframe. Alternatively, the individual regions may be arranged in a row. In this case, the dam bar may be in the form of one or more bars each positioned between adjacent individual regions. As yet another alternative, the leadframe may be formed of a single individual region and an outer frame part that supports the single individual region through its peripheral edge.

Furthermore, while the embodiments and variations above are described using a QFN-type leadframe as an example, the present invention may also be applied to other types of leadframes such as leadframes of a quad flat package (QFP) type and leadframes of a lead on chip (LOC) type.

Furthermore, while a QFN-type leadframe is illustrated as having die pads by way of example in the above-described embodiments and variations, the present invention may also be applied to QFN-type leadframes without die pads.

Various aspects of the subject-matter described herein may be set out non-exhaustively in the following numbered clauses:

1. A method of manufacturing a leadframe including an individual region to become a semiconductor device, the individual region including a first surface on which a semiconductor chip is to be mounted and a second surface facing away from the first surface, the method including:
forming the individual region by etching a metal plate; and
depressing a part of the second surface of the individual region toward the first surface to form a step surface by reducing a thickness of the individual region and forming an uneven surface part including depressions in the step surface, the step surface being to be covered with an encapsulation resin when the encapsulation resin encapsulates the individual region and the semiconductor chip.

2. The method of clause 1, wherein
a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and
a ratio of a surface area of the uneven surface part to a surface area of a planar surface in a case of forming the uneven surface part in the planar surface is 1.7 or more.

3. The method of clause 1, wherein
forming the individual region and forming the uneven surface part are performed in a single process by etching, using a single etching mask.

4. The method of clause 1, further including:
forming an outer frame part surrounding the individual region; and
reducing a thickness of the individual region on a side of the first surface of the individual region so that the thickness of the individual region is smaller than a thickness of the outer frame part.

5. The method of clause 4, wherein
forming the individual region, forming the outer frame part, and reducing the thickness of the individual region are performed in a single process by etching, using a single etching mask.

What is claimed is:

1. A semiconductor device, comprising:
a leadframe including a first surface and a second surface facing away from the first surface, the second surface having a part thereof depressed toward the first surface to form a step surface;
a semiconductor chip mounted on the first surface of the leadframe; and
an encapsulation resin encapsulating the leadframe and the semiconductor chip,
wherein the step surface includes an uneven surface part where depressions are formed, and is covered with the encapsulation resin, and
wherein a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm.

2. The semiconductor device as claimed in claim 1, wherein
the leadframe includes a terminal to serve as an external connection terminal, the terminal including a first surface and a second surface included in the first surface and the second surface, respectively, of the leadframe, and
a part of the second surface of the terminal is depressed toward the first surface of the terminal to form the step surface.

3. The semiconductor device as claimed in claim 2, wherein
the encapsulation resin includes a side surface at which a side surface of the terminal extending between the first surface and the second surface thereof is exposed, and includes a bottom surface at which a part of the second surface of the terminal other than the depressed part is exposed, and
the step surface is formed along a peripheral edge of the exposed part of the second surface of the terminal when viewed in a direction normal to the second surface of the leadframe.

4. The semiconductor device as claimed in claim 1, wherein
the leadframe includes a chip mounting part on which the semiconductor chip is mounted, the chip mounting part including a first surface and a second surface included in the first surface and the second surface, respectively, of the leadframe, and
a part of the second surface of the chip mounting part is depressed toward the first surface of the chip mounting part to form the step surface.

5. The semiconductor device as claimed in claim 4, wherein
the encapsulation resin includes a bottom surface at which a part of the second surface of the chip mounting part other than the depressed part is exposed, and
the step surface is formed around the exposed part of the second surface of the chip mounting part when viewed in a direction normal to the second surface of the leadframe.

6. The semiconductor device as claimed in claim 1, wherein the first surface includes an uneven surface part where depressions are formed.

7. A leadframe, comprising:
an individual region to become a semiconductor device, the individual region including a first surface on which a semiconductor chip is to be mounted, and a second surface facing away from the first surface and having a part thereof depressed toward the first surface to form a step surface, the step surface being to be covered with an encapsulation resin when the encapsulation resin encapsulates the individual region and the semiconductor chip,
wherein the step surface includes an uneven surface part where depressions are formed, and wherein a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm.

8. The leadframe as claimed in claim 7, further comprising:
a terminal to serve as an external connection terminal, included in the individual region, the terminal including a first surface and a second surface included in the first surface and the second surface, respectively, of the individual region, and
a part of the second surface of the terminal is depressed toward the first surface of the terminal to form the step surface.

9. The leadframe as claimed in claim 8, wherein the depressed part is a peripheral part of the second surface of the terminal.

10. The leadframe as claimed in claim 7, further comprising:
a chip mounting part on which the semiconductor chip is to be mounted, the chip mounting part being included in the individual region and including a first surface and a second surface included in the first surface and the second surface, respectively, of the individual region,
wherein a part of the second surface of the chip mounting part is depressed toward the first surface of the chip mounting part to form the step surface.

11. The leadframe as claimed in claim 10, wherein the depressed part is a peripheral part of the second surface of the chip mounting part.

12. The leadframe as claimed in claim 7, further comprising:
an outer frame part surrounding the individual region,
wherein a thickness of the individual region is smaller than a thickness of the outer frame part.

13. The leadframe as claimed in claim 7, wherein the first surface includes an uneven surface part where depressions are formed.

14. The semiconductor device as claimed in claim 1, wherein a ratio of a surface area of the uneven surface part to a surface area of a planar surface in a case of forming the uneven surface part in the planar surface is 1.7 or more.

15. The leadframe as claimed in claim 7, wherein a ratio of a surface area of the uneven surface part to a surface area of a planar surface in a case of forming the uneven surface part in the planar surface is 1.7 or more.

* * * * *